(12) United States Patent
Takahashi

(10) Patent No.: US 7,298,498 B2
(45) Date of Patent: Nov. 20, 2007

(54) OPTICAL PROPERTY MEASURING APPARATUS AND OPTICAL PROPERTY MEASURING METHOD, EXPOSURE APPARATUS AND EXPOSURE METHOD, AND DEVICE MANUFACTURING METHOD

(75) Inventor: Akira Takahashi, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/403,868

(22) Filed: Apr. 14, 2006

(65) Prior Publication Data
US 2006/0250607 A1 Nov. 9, 2006

Related U.S. Application Data

(63) Continuation of application No. PCT/JP2004/015119, filed on Oct. 14, 2004.

(30) Foreign Application Priority Data
Oct. 16, 2003 (JP) .............................. 2003-356186

(51) Int. Cl.
*G01B 9/02* (2006.01)
(52) U.S. Cl. ................................... 356/521
(58) Field of Classification Search ................ 356/124, 356/511, 512, 515, 521
See application file for complete search history.

(56) References Cited

U.S. PATENT DOCUMENTS 6,649,893 B2 * 11/2003 Fujimoto et al. ......... 250/201.2
6,765,683 B2 * 7/2004 Ichihara ..................... 356/521
6,819,414 B1 11/2004 Takeuchi
6,924,899 B2 * 8/2005 Hutchin et al. ............ 356/521
2004/0090606 A1 * 5/2004 Ishikawa ..................... 355/53

FOREIGN PATENT DOCUMENTS

| JP | A 2002-372406 | 12/2002 |
| JP | 2003-121300 | 4/2003 |
| JP | A 2003-262948 | 9/2003 |
| WO | WO 02/063664 A1 | 8/2002 |

* cited by examiner

*Primary Examiner*—Michael A. Lyons
(74) *Attorney, Agent, or Firm*—Oliff & Berridge, PLC

(57) ABSTRACT

By an insertion/withdrawal mechanism, a wavefront division optical element is inserted to an optical path of a light via an optical system to be examined, or the inserted wavefront division optical element is withdrawn from the optical path. Thus, it becomes possible without using a half mirror to make the light via the optical system to be examined be received at a detector via the wavefront division optical element, or the light via the optical system to be examined be received at the detector without the wavefront division optical element. Therefore, the measurement precision of optical properties obtained based on a detection signal from the detector cannot be deteriorated due to a polarization property existing in the half mirror. Accordingly, optical properties of the optical system to be examined can be detected with high precision.

23 Claims, 11 Drawing Sheets

Fig. 9A
Fig. 9B
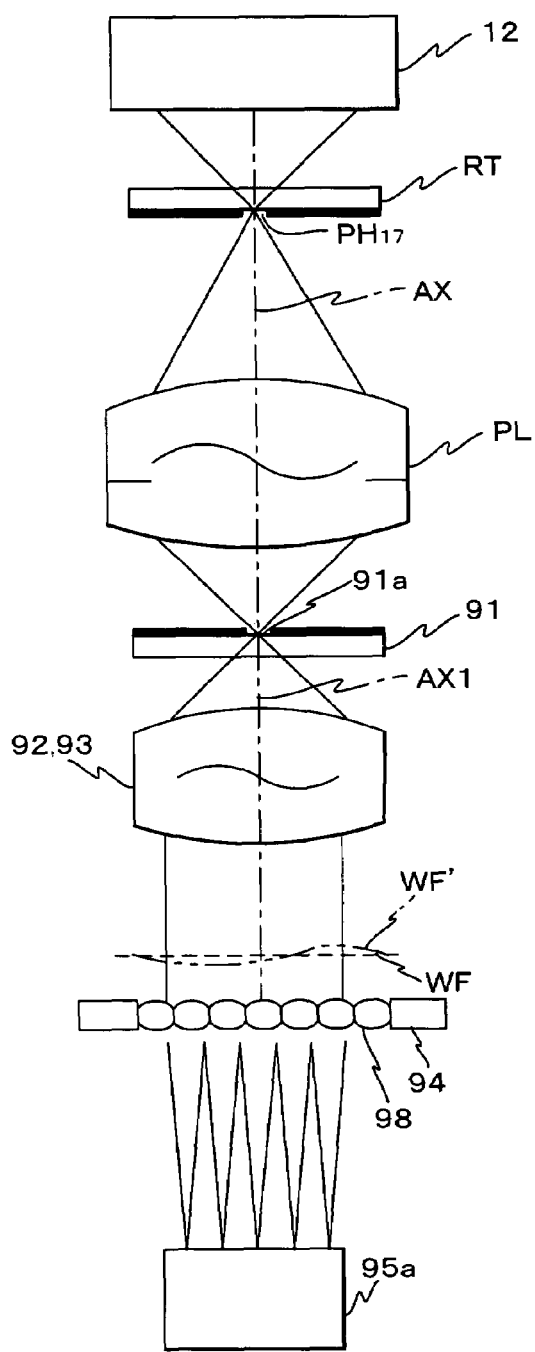
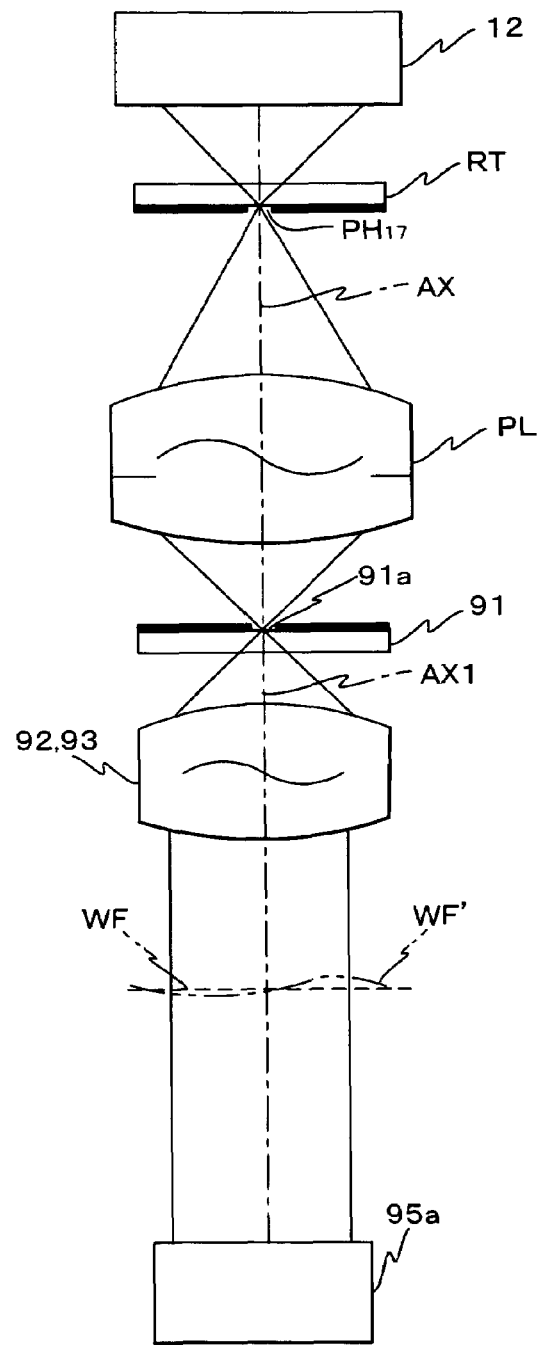

OPTICAL PROPERTY MEASURING APPARATUS AND OPTICAL PROPERTY MEASURING METHOD, EXPOSURE APPARATUS AND EXPOSURE METHOD, AND DEVICE MANUFACTURING METHOD

CROSS-REFERENCE TO RELATED APPLICATIONS

This is a continuation of International Application PCT/JP2004/015119, with an international filing date of Oct. 14, 2004, the entire content of which being hereby incorporated herein by reference, which was not published in English.

BACKGROUND OF THE INVENTION

1. Field of the Invention

The present invention relates to optical property measuring apparatus and optical property measuring method, exposure method and exposure apparatus, and device manufacturing method, and more particularly to an optical property measuring apparatus that receives a light via an optical system to be examined with a detector and measures optical properties of the optical system to be examined and an optical property measuring method, an exposure apparatus that comprises the optical property measuring apparatus and an exposure method that utilizes the optical property measuring method, and a device manufacturing method in which the exposure apparatus and the exposure method are used.

2. Description of the Related Art

Conventionally, an exposure apparatus that transfers a pattern formed on a mask or reticle (hereinafter generally referred to as 'reticle') onto an object such as a wafer coated with resist and the like or onto a glass plate (hereinafter referred to as 'wafer' as appropriate) via a projection optical system has been used in a lithographic process for manufacturing semiconductor devices, liquid-crystal displays and the like. As this type of exposure apparatus, in recent years, from the viewpoint of emphasizing the importance of throughput, projection exposure apparatus of a sequentially moving type are mainly used, such as the reduction projection exposure apparatus by the step-and-repeat method (the so-called stepper), and the scanning projection exposure apparatus by the step-and-scan method that is an improvement of the stepper.

In this type of exposure apparatus, it is important to accurately overlay and transfer a reduced image of a pattern of a reticle onto a shot area that has been already formed on the wafer. Therefore, it is required to adjust optical properties of a projection optical system and an illumination optical system so that a forming state of an image by the projection optical system becomes a desired state.

Thus, for the adjustment of optical properties described above, it is premised that the optical properties of optical systems such as the projection optical system are measured with good precision. For example, as image-forming characteristics of the projection optical system, conventionally, low-order aberrations that are known as Seidel's five aberrations were measured based on the exposure results of an image of a measurement pattern or the measurement results of an aerial image of the measurement pattern. In recent years, however, in order to cope with a finer device pattern according to higher integration of a semiconductor device, measurement of wavefront aberration that is a total aberration as the image-forming characteristics of the projection optical system has been relatively often performed.

The wavefront aberration of the projection optical system slightly changes before and after the projection optical system is installed into the body of the exposure apparatus. Therefore, various measuring units that measure the wavefront aberration of the projection optical system in the so-called on-body state (i.e. a state installed into the body of the exposure apparatus) are used. As one of this type of measuring units, a wavefront aberration measuring instrument by the Shack-Hartmann method using a microlens array is known.

A measurement principle of the wavefront aberration using the wavefront aberration measuring instrument is as follows. More specifically, a spherical wave generated from a pinhole formed on a reticle enters a projection optical system, and the light via the projection optical system enters the wavefront aberration measuring instrument fixed to a wafer stage. Then, a wavefront of the light at a pupil plane of the projection optical system is divided by a microlens array arranged in the vicinity of a plane conjugate with the pupil plane of the projection optical system, and an image of the pinhole (a spot image) is formed on an imaging plane of a CCD by each lens element making up the microlens array. In this case, the wavefront aberration of the projection optical system can be calculated by performing a predetermined computation based on a position deviation of each spot image from a datum point.

In order to accurately obtain the position deviation of each spot image from the datum point, it is required to measure a position and a shape of the pupil plane of the projection optical system, and a wavefront aberration measuring instrument having the following configuration is also known (e.g. refer to Patent Document 1): a half mirror is arranged inside the wavefront aberration measuring instrument, the light incident on the wavefront aberration measuring instrument is branched by the half mirror, and one branched beam enters a CCD via the microlens array and the other branched beam enters another CCD (a CCD for pupil measurement) without passing though the microlens array.

The half mirror has the following polarization properties. More particularly, the light reflecting off the half mirror has a high intensity of S polarization and a low intensity of P polarization, while the light passing through the half mirror has a low intensity of S polarization and a high intensity of P polarization. As a matter of course, there are slight differences in polarization properties depending on the material of a semi-transmissive film (reflective film having transmittance that is not zero) to be used for the half mirror, however, it is difficult to manufacture a semi-transmissive film having no polarization properties.

Meanwhile, with the projection exposure apparatus, it is likely that the aberration of the projection optical system (a projection lens) is different depending on a polarization direction, or it is also likely that an illumination light is polarized.

Therefore, with the wavefront aberration measuring instrument disclosed in Patent Document 1 described above, measurement precision could be deteriorated due to the polarization properties existing in the half mirror described above.

Besides the wavefront aberration measuring instrument by the Shack-Hartmann method described above, as a device to measure the wavefront aberration of the projection optical system, various interferometers (such as a Twyman-Green interferometer, a shearing interferometer, and a point diffraction interferometer) are also known. However, because most of these interferometers have a half mirror, the measurement precision could be deteriorated likewise, due to the polarization properties existing in the half mirror.

Patent Document 1: Kokai (Japanese Unexamined Patent Application Publication) No. 2003-262948.

SUMMARY OF THE INVENTION

The present invention has been made in consideration of the situation described above, and has as its first object to provide an optical property measuring apparatus and an optical property measuring method that can measure optical properties of an optical system to be examined with high precision.

The second object of the present invention is to provide an exposure apparatus and an exposure method that can transfer a pattern formed on a mask onto a photosensitive object with good precision.

The third object of the present invention is to provide a device manufacturing method that can improve the productivity of microdevices.

According to a first aspect of the present invention, there is provided an optical property measuring apparatus that measures optical properties of an optical system to be examined, the apparatus comprising: an optical system that includes an wavefront division optical element which can be inserted and withdrawn with respect to an optical path of a light via the optical system to be examined and which divides a wavefront of the light via the optical system to be examined when being inserted to the optical path of the light; an insertion/withdrawal mechanism that inserts and withdraws the wavefront division optical element with respect to the optical path; and a detector that receives the light via the optical system, and outputs a detection signal including information on optical properties of the optical system to be examined.

With this optical property measuring apparatus, by the insertion/withdrawal mechanism, the wavefront division optical element is inserted to the optical path of the light via the optical system to be examined, or the inserted wavefront division optical element is withdrawn from the optical path. And, in a state where the wavefront division optical element is inserted to the optical path, the light via the optical system to be examined is received by the detector via the wavefront division optical element, and a detection signal including information on the optical properties of the optical system to be examined is output from the detector. In this case, because the wavefront of the light via the optical system to examined is divided by the wavefront division optical element, the detection signal including information on the optical properties of the optical system to be examined related to each divided wavefront is output from the detector.

Meanwhile, in a state where the wavefront division optical element is withdrawn from the optical path, the light via the optical system to be examined is received by the detector without passing though the wavefront division optical element, and a detection signal including information on the optical properties of the optical system to be examined is output. In this case, the detection signal including information on the optical properties of the optical system to be examined related to the shape and position of a pupil plane of the optical system to be examined is output from the detector.

In either case, because the light via the optical system to be examined is received by the detector without a half mirror, measurement precision of the optical properties obtained based on the detection signal from the detector cannot be deteriorated due to a polarization property existing in the half mirror. Therefore, the optical properties of the optical system to be examined can be measured with high precision.

In this case, the wavefront division optical element may be arranged at a position in the vicinity of a plane conjugate with a pupil of the optical system to be examined. In such a case, the wavefront division optical element is inserted to the optical path at the position in the vicinity of the plane conjugate with the pupil of the optical system to be examined.

With the optical property measuring apparatus of the present invention, the wavefront division optical element may be a microlens array.

The optical property measuring apparatus of the present invention may further comprise: a processor that calculates optical properties of the optical system to be examined by performing a predetermined computation, based on the detection signal from the detector.

In this case, the processor may calculate a first optical property of the optical system to be examined based on the detection signal from the detector in a state where the wavefront division optical element is inserted to the optical path by the insertion/withdrawal mechanism.

In this case, the first optical property may be a wavefront aberration of the optical system to be examined.

With the optical property measuring apparatus of the present invention, the processor may calculate a second optical property of the optical system to be examined based on the detection signal from the detector in a state where the wavefront division optical element is withdrawn from the optical path by the insertion/withdrawal mechanism.

In this case, the second optical property may be an optical property related to information on at least one of a position and a shape of a light source image on a pupil plane of the optical system to be examined or a plane conjugate with the pupil plane.

In this case, the second optical property may be one of numerical aperture and a coherence factor of an illumination optical system constituting the optical system to be examined.

According to a second aspect of the present invention, there is provided an exposure apparatus that transfers a pattern formed on a mask onto a photosensitive object, the apparatus comprising: an illumination optical system that illuminates the mask with an illumination light; a projection optical system that projects the illumination light emitted from the mask on the photosensitive object; an object stage that moves two-dimensionally holding the photosensitive object; and the optical property measuring apparatus of the present invention that is attached to the object stage so that the projection optical system becomes the optical system to be examined.

With this exposure apparatus, the mask is illuminated with the illumination light from the illumination optical system, and the illumination light emitted from the mask is projected on the photosensitive object (i.e. on a surface where the photosensitive object is arranged) by the projection optical system. The photosensitive object is mounted on the object stage that moves two-dimensionally holding the photosensitive object. The optical property measuring apparatus of the present invention is attached to the object stage so that the projection optical system becomes the optical system to be examined. Therefore, by receiving the illumination light from the illumination optical system at the optical property measuring apparatus via the projection optical system with or without the mask, for example, at least a part of optical properties of the optical system to be examined that is made up of the projection optical system and the illumination optical system can be measured with high precision in the so-called on-body state. Thus, after adjustment of the projection optical system and the like is performed based on the measurement results, exposure is performed, which makes it possible to transfer the pattern formed on the mask onto the photosensitive object with good precision.

In this case, the optical property measuring apparatus may be permanently mounted to the object stage, or for example, at least a part of the optical property measuring apparatus may be freely detachable to the object stage.

According to a third aspect of the present invention, there is provided An optical property measuring method in which optical properties of an optical system to be examined is measured, the method comprising: a first detection process in which a first information is detected based on a light via the optical system to be examined and a wavefront division optical element, in a first state where the wavefront division optical element is inserted to an optical path of a light via the optical system to be examined; a second detection process in which a second information is detected based on a light via the optical system to be examined, in a second state where the wavefront division optical element is withdrawn from the optical path; and a calculation process in which optical properties of the optical system to be examined is calculated based on the first information and the second information.

With this method, in either of the first state and the second state, the light via the optical system to be examined is received at the detector without a half mirror, and the first information and the second information are detected. Accordingly, measurement precision of the optical properties obtained based on the first information and the second information cannot be deteriorated due to a polarization property existing in the half mirror. Therefore, the optical properties of the optical system to be examined can be measured with high precision.

According to a fourth aspect of the present invention, there is provided an exposure method, comprising: a process in which the optical property measuring method of the present invention is executed; and a process in which a pattern is transferred onto a photosensitive object using the projection optical system to which the optical property measuring method has been executed.

With this method, the optical properties of the projection optical system are measured with high precision. Therefore, for example, it is possible to adjust the optical properties of the projection optical system based on the measurement results, and by transferring the pattern onto the photosensitive object using the projection optical system, it becomes possible to transfer the pattern with good precision.

In addition, in the lithographic process exposure is performed using the exposure apparatus of the present invention, and therefore a pattern can be formed on a photosensitive object with good precision, which makes it possible to manufacture higher-integration microdevices with good yield. Similarly, in the lithographic process exposure is performed using the exposure method of the present invention, and therefore a pattern can be formed on a photosensitive object with good precision, which makes it possible to manufacture higher-integration microdevices with good yield. Accordingly, it can also be said from another aspect that the present invention is a device manufacturing method in which the exposure apparatus or the exposure method of the present invention is used.

BRIEF DESCRIPTION OF THE DRAWINGS

In the accompanying drawings;

FIG. 9A is a view showing an optical arrangement when picking up a spot image in the embodiment;

FIG. 9B is a view showing an optical arrangement when picking up a pupil image in the embodiment;

DESCRIPTION OF THE EMBODIMENTS

An embodiment of the present invention will be described below, referring to FIGS. 1 to 9B.

Figure 1:
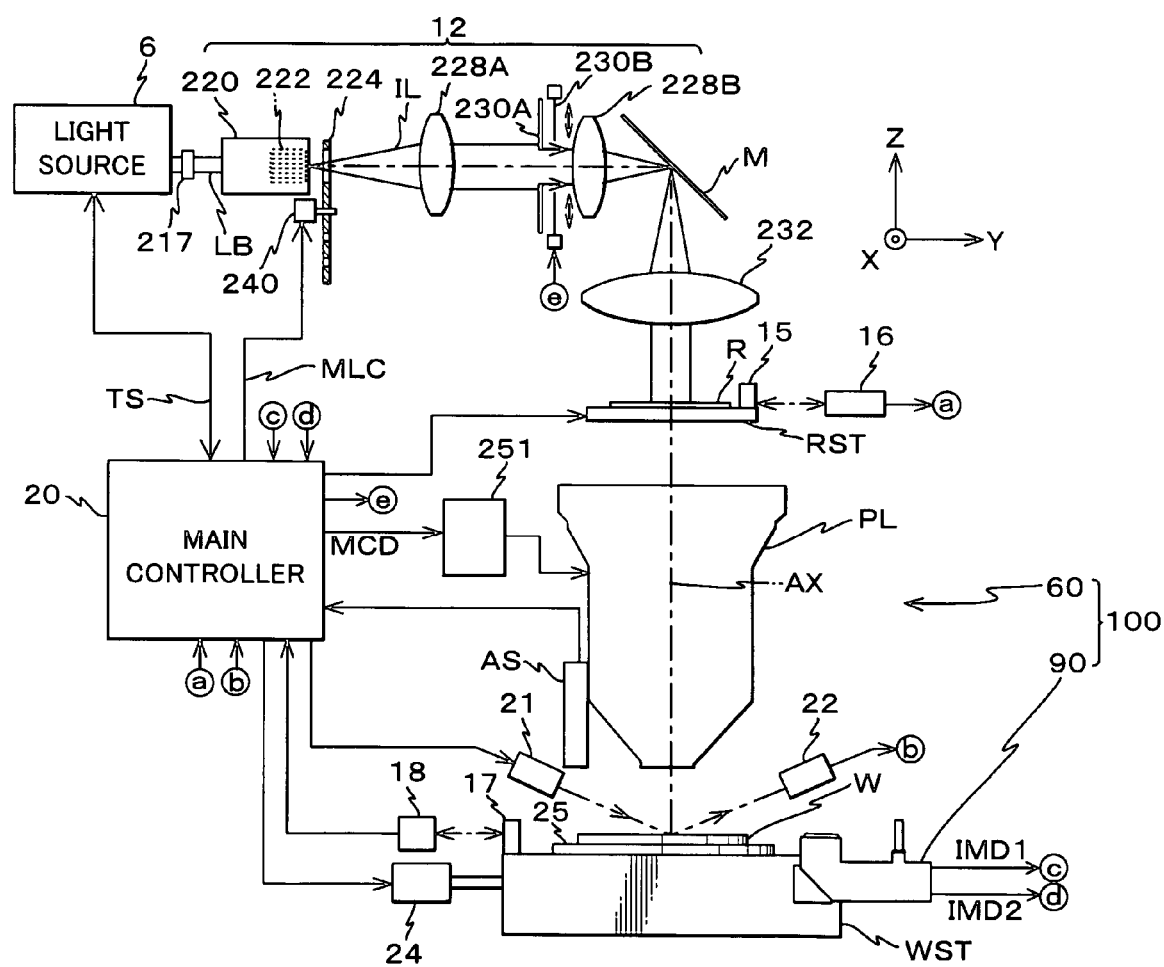
FIG. 1 is a view schematically showing a configuration of an exposure apparatus in an embodiment.

FIG. 1 schematically shows the entire configuration of an exposure apparatus 100 related to the embodiment. Exposure apparatus 100 is a projection exposure apparatus by the step-and-scan method. Exposure apparatus 100 is equipped with an exposure apparatus main body 60 and a wavefront sensor 90.

Exposure apparatus main body 60 is equipped with: an illumination system including a light source 6 and an illumination optical system 12; a reticle stage RST that holds a reticle R; a projection optical system PL; a wafer stage WST serving as an objection stage on which a wafer W serving as a photosensitive object is mounted; an alignment detection system AS by an off-axis method; a main controller 20 consisting of computers such as a workstation that has overall control over the entire apparatus, and the like.

As light source 6, in this case, an ArF excimer laser (output wavelength: 193 nm) is used. As light source 6, a light source emitting pulse light of vacuum ultraviolet region such as an $F_2$ laser (output wavelength: 157 nm) and a light source emitting pulse light of near-ultraviolet region such as a KrF excimer laser (output wavelength: 248 nm) may also be used.

In actual, light source 6 is arranged in a separate room, which is a service room having a lower degree of cleanliness than that of a clean room where a chamber (not shown) that houses exposure apparatus main body 60 composed of illumination optical system 12, reticle stage RST, projection optical system PL, wafer stage WST, and the like is arranged. Light source 6 connects to the chamber via a light transmitting optical system (not shown), which includes at least an optical system for optical axis adjustment called a beam matching unit (BMU) in a part of its system. Light source 6 controls the on/off of the output of laser beam LB, the energy of laser beam LB per pulse, the oscillation frequency (the repetition frequency), the center wavelength and the spectral line half width, and the like by an internal controller, based on control information TS from main controller 20.

Illumination optical system 12 comprises: a beam-shaping illuminance uniformity optical system 220, which includes a cylinder lens, a beam expander and a zoom optical system (none of which are shown), and an optical integrator (homogenizer) 222; an illumination system aperture stop plate 224; a first relay lens 228A; a second relay lens 228B; a fixed reticle blind 230A; a movable reticle blind 230B; an optical path deflecting mirror M; a condenser lens 232, and the like. As optical integrator 222, a fly-eye lens, an internal reflection type integrator (a rod integrator), or a diffractive optical element can be used. In the embodiment, a fly-eye lens is used, therefore, hereinafter it will also be referred to as 'fly-eye lens 222'.

Beam-shaping illuminance uniformity optical system 220 connects to a light transmitting optical system (not shown) via a light transmitting window 217. Beam-shaping illuminance uniformity optical system 220 shapes the sectional shape of laser beam LB, which is the pulsed light emitted from light source 6 and enters beam-shaping illuminance uniformity optical system 220 via light transmitting window 217, using, for example, a cylinder lens or a beam expander. Then, when the laser beam which sectional shape has been shaped enters fly-eye lens 222 located inside beam-shaping illuminance uniformity optical system 220 on the exit side, fly-eye lens 222 forms a surface light source (a secondary light source) that is composed of multiple point light sources (light source images) on the focusing plane on the exit side of the laser beam (substantially coincident with the pupil plane of illumination optical system 12), in order to illuminate reticle R with uniform illuminance distribution. Hereinafter, the laser beam emitted from the secondary light source will be referred to as 'illumination light IL'.

In the vicinity of the focusing plane on the exit side of fly-eye lens 222, illumination system aperture stop plate 224 constituted by a discoidal member is arranged. On illumination system aperture stop plate 224, for example, an aperture stop (conventional stop) composed of a typical circular opening, an aperture stop (small C stop) for making coherence factor σ value small composed of a small, circular opening, a ring-like aperture stop (annular stop) for annular illumination, a modified aperture stop for modified illumination composed of a plurality of openings disposed in an eccentric arrangement, and the like are arranged at a substantially equal angle (only two types of aperture stop are shown in FIG. 1).

Illumination system aperture stop plate 224 is rotated by driving of a drive unit 240 such as a motor or the like that is controlled by a control signal MLC from main controller 20, and any one of the aperture stops is selectively set on the optical path of illumination light IL, so that the shape and size of the secondary light source (the light quantity distribution of illumination light) on the pupil plane is limited to a ring, a small circle, a large circle, four eyes or the like. In the embodiment, using aperture stop plate 224, the light quantity distribution of illumination light on the pupil plane of illumination optical system 12 (the shape and size of the secondary light source) is changed, that is, an illumination condition of reticle R is changed. It is preferable, however, to suppress light quantity loss due to the change of the illumination condition to the minimum by making intensity distribution of illumination light or a range of incident angle of the illumination light on the incident plane of optical integrator (fly-eye lens) 222 variable. Therefore, instead of, or combined with aperture stop plate 224, for example, a configuration may be employed in which an optical unit that includes at least one of a plurality of diffractive optical elements arranged switchable on the optical path of illumination optical system 12, at least one prism (such as a cone prism or a polyhedral prism) movable along an optical axis of illumination optical system 12, and a zoom optical system is arranged in between light source 6 and optical integrator (fly-eye lens) 222.

On the optical path of illumination light IL outgoing from illumination system aperture stop plate 224, a relay optical system composed of a first relay lens 228A and a second relay lens 228B is arranged, with a fixed reticle blind 230A and a movable reticle blind 230B disposed in between.

Fixed reticle blind 230A is arranged on a plane slightly defocused from a plane conjugate to the pattern surface of reticle R, and a rectangular opening is formed thereon that defines an illumination area on reticle R. In addition, in the vicinity of fixed reticle blind 230A (a plane conjugate to the pattern surface of reticle R), movable reticle blind 230B is arranged having an opening section which position and width are variable in directions respectively corresponding to a scanning direction (a Y-axis direction in this case) and a non-scanning direction (an X-axis direction). When scanning exposure starts and ends, exposure on an unnecessary part is prevented by further restricting the illumination area on reticle R via movable reticle blind 230B by control of main controller 20.

On the optical path of illumination light IL in the rear of the second relay lens 228B making up the relay optical system, deflecting mirror M is disposed that reflects illumination light IL that has passed through the second relay lens 228B towards reticle R, and in the rear of mirror M on the optical path of illumination light IL, condenser lens 232 is disposed.

In the configuration described so far, the incident surface of fly-eye lens 222, the plane on which movable reticle blind 230B is disposed, and the pattern surface of reticle R are set optically conjugate with one another, while the focusing plane on the exit side of fly-eye lens 222 (the pupil plane of the illumination optical system 12) and the pupil plane of projection optical system PL are set optically conjugate.

The operation of illumination optical system 12 having such a configuration will now be briefly described. Laser beam LB, which is the pulsed light emitted from light source 6, enters beam-shaping illuminance uniformity optical system 220 where the sectional shape of the beam is shaped, and then enters fly-eye lens 222. With this operation, the secondary light source previously described is formed on the focusing plane on the exit side of fly-eye lens 222.

Illumination light IL emitted from the secondary light source described above passes through one of the aperture stops formed on illumination system aperture stop plate 224, and then passes through the rectangular opening of fixed reticle blind 230A and movable reticle blind 230B via the first relay lens 228A. Then, illumination light IL passes through the second relay lens 228B and the optical path of illumination light IL is bent perpendicularly downward by mirror M, and then illumination light IL proceeds through condenser lens 232 and illuminates the rectangular illumination area on reticle R held on reticle stage RST with a uniform illuminance distribution.

On reticle stage RST, reticle R is fixed by, for example, vacuum chucking. Reticle stage RST, in this case, has a structure finely drivable within an XY plane perpendicular to optical axis AX of projection optical system PL by a reticle drive section (not shown) made up of a linear motor or the like and is also drivable at a designated scanning velocity in a predetermined scanning direction (the Y-axis direction).

The position of reticle stage RST within a stage-moving plane is measured at a resolution of, for example, approximately 0.5 to 1 nm with a reticle laser interferometer (hereinafter referred to as 'reticle interferometer') 16 at all times via a movable mirror 15. Position information (or velocity information) of reticle stage RST from reticle interferometer 16 is sent to main controller 20, and main controller 20 moves reticle stage RST via reticle stage drive section (drawing omitted) based on the position information (or velocity information).

Projection optical system PL is disposed below reticle stage RST in FIG. 1, and the direction of optical axis AX of projection optical system PL is a Z-axis direction. Projection optical system PL is, for example, a both-side telecentric reduction system, and is made up of a plurality of lens elements (not shown) having optical axis AX in the Z-axis direction in common. In addition, the projection magnification $\beta$ of projection optical system PL is for example, ¼, ⅕, or ⅙. Therefore, when the illumination area on reticle R is illuminated with illumination light (exposure light) IL as is described above, a pattern formed on reticle R is projected and transferred on a slit-shaped exposure area on wafer W which surface is coated with a resist (photosensitive agent), as an image (partially inverted image) reduced by projection magnification $\beta$ by projection optical system PL.

In the embodiment, of the plurality of lens elements described above, specific lens elements (for example, predetermined five elements) are individually movable. Such movement of specific lens elements is performed by drive elements such as three piezo elements arranged per each specific lens element. That is, by individually driving these drive elements, the specific lens elements may individually be moved in parallel along optical axis AX in accordance with the displacement amount of each drive element, and a desired tilt with respect to the plane perpendicular to optical axis AX may be added to the specific lens elements individually. In the embodiment, a drive instruction signal to drive the drive elements described above is output by an image-forming characteristic correction controller 251 based on instruction MCD from main controller 20, and the displacement amount of each drive element is controlled according to the drive instruction signal.

In projection optical system PL having the configuration described above, movement control of the lens elements by main controller 20 via image-forming characteristic correction controller 251 makes it possible to adjust the various aberration (one of optical characteristics) such as distortion, curvature of field, astigmatism, comma, spherical aberration and the like.

Wafer stage WST is arranged on a base (not shown) below projection optical system PL in FIG. 1, and on the upper surface of wafer stage WST wafer holder 25 is mounted. On wafer holder 25, wafer W is fixed, for example, by vacuum chucking.

Wafer stage WST is driven in a scanning direction (the Y-axis direction) and a non-scanning direction (the X-axis direction) perpendicular to the scanning direction by wafer stage drive section 24 including a motor and the like. With wafer stage WST, a step-and-scan operation is performed in which an operation for relatively scanning wafer W to reticle R to perform scanning exposure on each shot area of wafer W and an operation for moving wafer W to a scanning starting position (acceleration starting position) to expose the next shot are repeated.

The position of wafer stage WST within the XY plane is detected with a resolution of, for example, approximately 0.5-1 nm at all times via movable mirror 17 by a wafer laser interferometer (hereinafter referred to as 'wafer interferometer') 18. Position information (or velocity information) of wafer stage WST is sent to main controller 20, and main controller 20 performs drive control of wafer stage WST via wafer stage drive section 24 based on the position information (or velocity information).

In addition, wafer stage WST is finely driven also in the Z-axis direction, $\theta x$ direction (rotational direction around the X-axis: pitching direction), $\theta y$ direction (rotational direction around the Y-axis: rolling direction), and $\theta z$ direction (rotational direction around the Z-axis direction: yawing direction).

In addition, on the +Y side of wafer stage WST, a sensor attaching section having a shape into which wavefront sensor 90 to be described later can be fitted.

Alignment detection system AS described above is arranged on a side surface of projection optical system PL. In the embodiment, as an example, an image-forming alignment sensor that detects a street line or a position detection mark (fine alignment mark) formed on wafer W is used as alignment detection system AS. The detailed configuration of the alignment sensor similar to alignment detection system AS is disclosed in, for example, Kokai (Japanese Unexamined Patent Application Publication) No. 9-219354, and the corresponding U.S. Pat. No. 5,859,707, and the like. The detection results by alignment detection system AS is supplied to main controller 20. As long as the national laws in designated states (or elected states), to which this international application is applied, permit, the above disclosures of the publication and the U.S. patent are incorporated herein by reference.

Further, in exposure apparatus 100 in FIG. 1, a multiple focal point position detection system (21, 22) that is one of the focus detection systems by the oblique incident method is arranged and used for detecting a position in the Z-axis direction (direction of optical axis AX) within the exposure area and the areas close to the exposure area on the surface of wafer W. The detailed configuration of the multiple focal point position detection system (21, 22) and the like are disclosed in, for example, Kokai (Japanese Unexamined Patent Application Publication) No. 6-283403, and the corresponding U.S. Pat. No. 5,448,332, and the like. The detection results by the multiple focal point position detection system (21, 22) are supplied to main controller 20. As long as the national laws in designated states (or elected states), to which this international application is applied, permit, the above disclosures of the publication and the U.S. patent are incorporated herein by reference.

Figure 2:
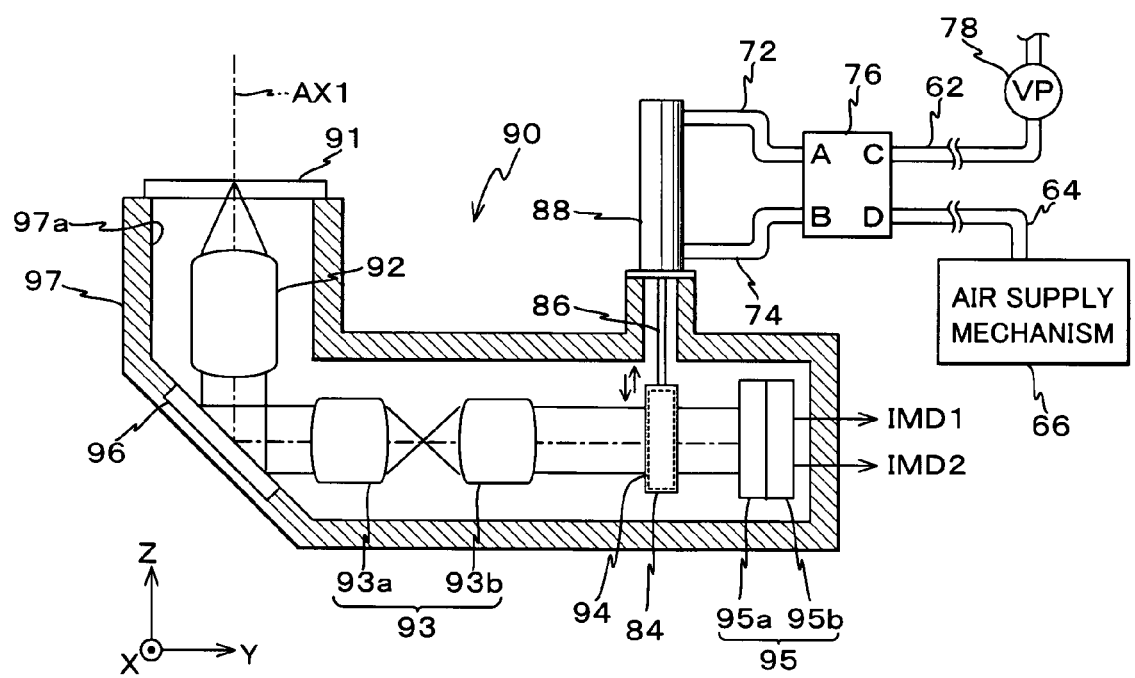
FIG. 2 is a view schematically showing a configuration of a wavefront sensor in FIG. 1.

As wavefront sensor 90 described previously, a wavefront sensor by the Shack-Hartmann method using a microlens array in a light-receiving optical system is used. Wavefront sensor 90 comprises, as shown in FIG. 2, a housing 97 having inner space that is roughly shaped in the letter L in YZ section, a light-receiving optical system as an optical system composed of a plurality of optical elements arranged in a predetermined position relation within housing 97, and a detector 95 arranged at an end section on the +Y side within housing 97.

Housing 97 has a space having L-shaped YZ section formed inside, and is composed of a member having an opening at the uppermost section (an end surface on the +Z side). An opening 97a having a circular shape in a planar view at the uppermost section of housing 97 is closed with a marking plate 91.

Figure 3:
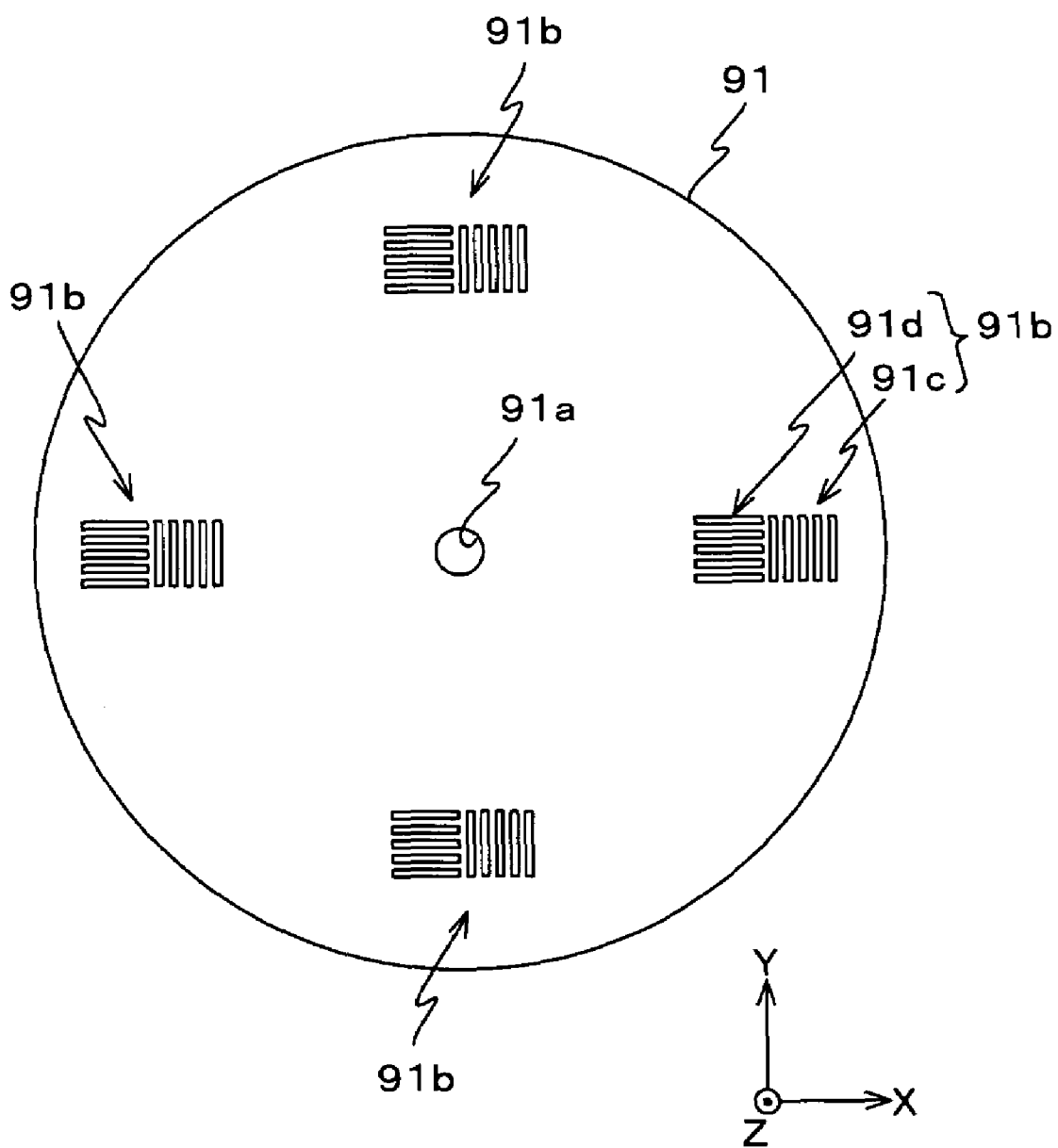
FIG. 3 is a view showing a surface state of a marking plate in FIG. 2.

Marking plate 91 is, for example, made of a glass substrate as a base material, and arranged at a position (a position in the Z-axis direction) having the same height as the surface of wafer W mounted on wafer holder 25 so as to be orthogonal to an optical axis AX1 (refer to FIG. 1). On the surface of marking plate 91, a light shielding film also serving as a reflection film is formed by vapor deposition of metal such as chromium. In the center of the light shielding film, as shown in FIG. 3, a circular opening 91a is formed. In this case, the light shielding film shields unnecessary light from entering the light-receiving optical system from the surrounding area when wavefront aberration of projection optical system PL is measured. In addition, on the periphery of opening 91a of the light shielding film, three or more pairs (4 pairs in FIG. 3) of two-dimensional position detection mark 91b are formed, of which a position relation with opening 91a is known in design. As the two-dimensional position detection mark 91b, in the embodiment, the combination of line-and-space mark 91c formed along the Y-axis direction and line-and-space mark 91d formed along the X-axis direction is employed. Line-and-space marks 91c and 91d can be detected by alignment detection system AS described above.

The light-receiving optical system is composed of collimator lens 92 as an objective lens, a deflecting mirror 96, a relay-lens system 93 made up of a lens 93a and a lens 93b sequentially arranged on the +Y side of deflecting mirror 96, and a microlens array 94 as a wavefront division optical element, which are sequentially arranged from top to bottom within housing 97 below marking plate 91. Deflecting mirror 96 is attached to housing 97 in a state having an inclination of 45°, and by deflecting mirror 96, the optical path of the light entering collimator lens 92 from above in a downward vertical direction via opening 91a of marking plate 91 is deflected toward relay-lens system 93. Collimator lens 92, lens 93a and 93b, and the like constituting the light-receiving optical system are fixed via a holding member (not shown) to the wall of housing 97 on the inner side, respectively.

In this case, the light incident on collimator lens 92 is converted into parallel beams by collimator lens 92, and then the parallel beams enter microlens array 94 via deflecting mirror 96 and relay-lens system 93.

Figure 4A:
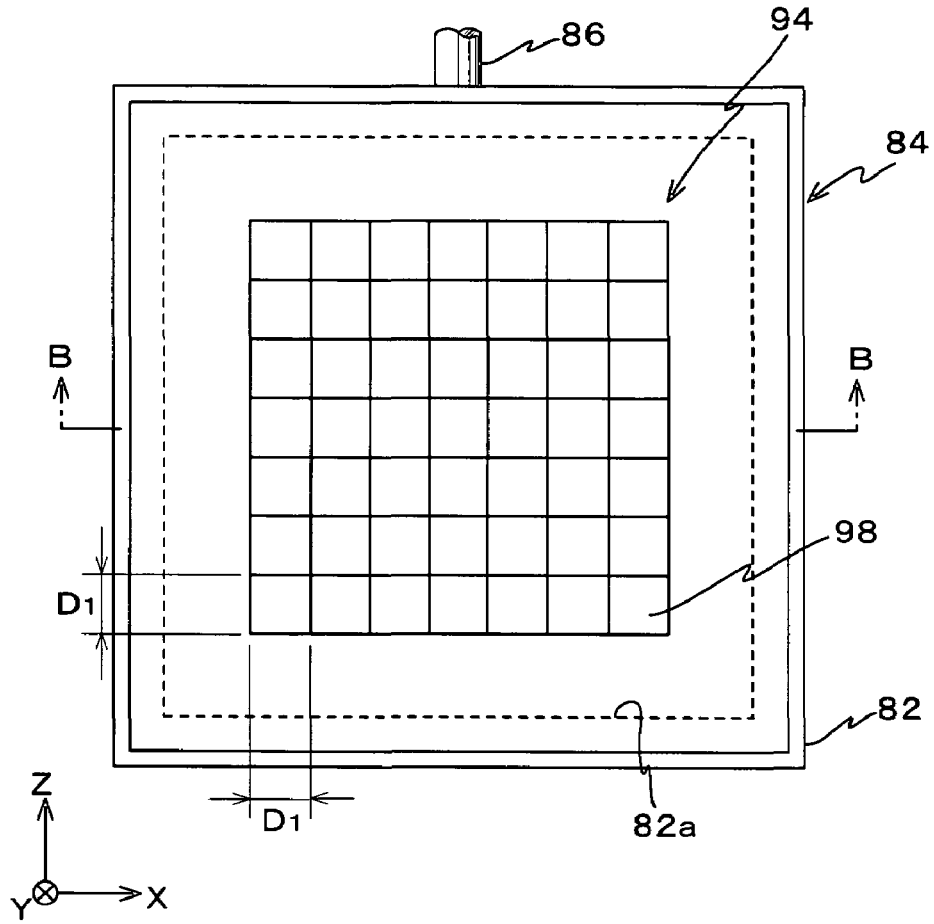
FIG. 4A is a front view of a wavefront division unit viewing from the −Y side to the +Y side.

Microlens array 94 is, as shown in FIG. 4A, held by a holding member 82 having a square frame shape, and microlens array 94 and holding member 82 constitute a wavefront division unit 84 (refer to FIG. 2).

Figure 4B:
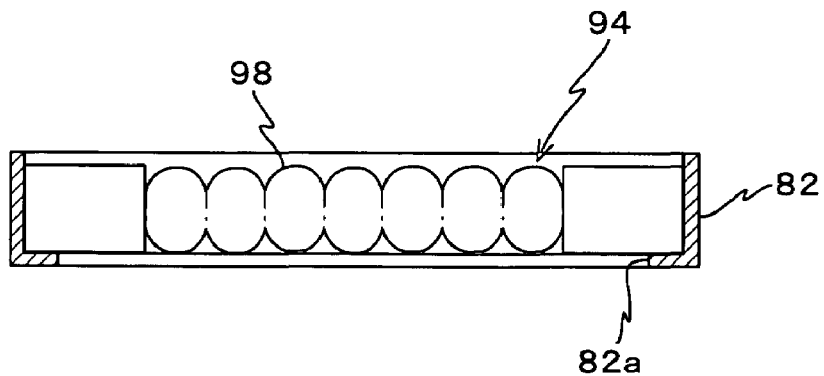
FIG. 4B is a sectional view taken along the line B-B in FIG. 4A.

In FIG. 4A the front view of wavefront division unit 84 viewing from the −Y side to +Y side is shown, and in FIG. 4B the sectional view taken along the line B-B in FIG. 4A is shown. As can be seen from FIGS. 4A and 4B referred together, holding member 82 is made of a square shaped frame member having an L sectional shape, and a square opening 82a is formed by the end surface on the inner circumference side of holding member 82. One end of a piston rod 86 is fixed to the upper end (the +Z side end) of holding member 82. At the other end of piston rod 86, a piston (not shown) is arranged, and the piston is housed inside an air cylinder 88 shown in FIG. 2.

To the vicinity of one end section (upper end section) and to the vicinity of the other end section (lower end section) of air cylinder 88, one end of an air piping 72 and one end of an air piping 74 are connected, respectively. In this case, inside air cylinder 88, a space zoned by the piston and the inner wall of air cylinder 88 is formed at one side (upper side) and the other side (lower side) of the piston, respectively. Meanwhile, an air vent path inside air piping 72 is communicated with a space on one side of the piston, and an air vent path inside air piping 74 is communicated with a space on the other side of the piston.

The other end of air piping 72 is connected to a port A of a flow path switching valve 76 made up of four valves, and the other end of air piping 74 is connected to a port B of flow path switching valve 76. One end of a piping 62 is connected to a vacuum pump 78 while the other end is connected to a port C of flow path switching valve 76, and one end of a piping 64 is connected to an air supply mechanism 66 incorporating a compressor while the other end is connected to a port D of flow path switching valve 76. Flow path switching valve 76 is controlled by main controller 20, and performs the switching between a first state where port A and port C are connected and port B and port D are connected, and a second state where port A and port D are connected and port B and port C are connected. On/off operations of vacuum pump 78 and air supply mechanism 66 are also controlled by main controller 20.

For example, when main controller 20 switches flow path switching valve 76 to the second state and turns on both vacuum pump 78 and air supply mechanism 66, the piston inside air cylinder 88 is pushed down by a pressure of the air flowed in from air supply mechanism 66 and the pressure difference between two spaces inside air cylinder 88 due to negative pressure generated in vacuum pump 78. Consequently, wavefront division unit 84 moves from a first position that is away from the optical path (e.g. the upper side moving limit position) to a second position shown in FIG. 2 (the lower side moving limit position). The second position is set in advance as a position where the center of microlens array 94 constituting wavefront division unit 84 substantially coincides with optical axis AX1. After wavefront division unit 84 moves to the second position, in the case of maintaining this state, vacuum pump 78 and air supply mechanism 66 may be kept turned on, or one of vacuum pump 78 and air supply mechanism 66 may be turned off.

Meanwhile, when wavefront division unit 84 is at the second position shown in FIG. 2, main controller 20 switches flow path switching valve 76 to the first state, and further turns on vacuum pump 78 and air supply mechanism 66 (in the case only one of vacuum pump 78 and air supply mechanism 66 is turned off, turns on only the one that is turned off.) By this operation, the piston inside air cylinder 88 is pushed up by a pressure of the air flowed in from air supply mechanism 66 and the pressure difference between two spaces inside air cylinder 88 due to negative pressure generated in vacuum pump 78, and wavefront division unit 84 moves from the second position to the first position (the upper side moving limit position) and withdraws from the optical path.

In this manner, in the embodiment, air cylinder 88, flow path switching valve 76, vacuum pump 78 and air supply mechanism 66 constitute an insertion/withdrawal mechanism that inserts and withdraws microlens array 94 as a wavefront division optical element to and from the optical path. In order to more smoothly and securely perform the above movement in the vertical direction of wavefront division unit 84, a guide may be arranged so as to guide holding member 82.

Microlens array 94 is made up of a plurality of small lenses (microlenses) arranged in an array shape on a plane perpendicular to the optical path. More specifically, as comprehensively shown in FIGS. 4A and 4B, microlens array 94 is made up of multiple square-shaped microlenses 98 that are densely arranged in a matrix, each having a side length of $D_1$. Microlens 98 is a lens having positive refracting power. Optical axes of microlenses 98 are substantially parallel to one another. In FIG. 4A, microlens 98 arranged in a 7×7 matrix is shown as an example. Microlens array 94 is produced by performing the etching process on a plane-parallel glass plate. With microlens array 94, each microlens 98 emits an image-forming beam of an image via a pinhole pattern, which will be described later, formed at opening 91a of marking plate 91.

Detector 95 is composed of a light-receiving element 95a made up of a two-dimensional CCD or the like (hereinafter referred to as 'CCD') and an electric circuit 95b such as, for example, a charge-transfer control circuit. CCD 95a has an area large enough for receiving all beams that enter collimator lens 92 and are emitted from microlens array 94. CCD 95a is an image-forming plane on which an image of the pinhole pattern, to be described later, formed at opening 91a is formed again by each microlens 98 of microlens array 94, and has a light-receiving surface which is a plane optically conjugate with the forming plane of opening 91a. In addition, the light-receiving surface is located on a plane slightly deviated from a plane conjugate with a pupil plane of projection optical system PL when microlens array 94 is in a state withdrawn from the optical path.

When microlens array 94 is at the second position, detector 95 sends the imaging results of an image of the pinhole pattern described above formed again by each microlens 98 to main controller 20, as imaging data IMD1. When microlens array 94 is at the first position, detector 95 sends the imaging results of an image formed on the light-receiving surface to main controller 20, as imaging data IMD2.

The outer shape of housing 97 is a shape that is fitted into the sensor attaching section of wafer stage WST described above, and housing 97 is freely detachable to wafer stage WST.

Furthermore, with exposure apparatus 100 of the embodiment, above reticle R, a pair of reticle alignment systems are arranged composed of a TTR (Through the Reticle) alignment optical system using an exposure wavelength for observing a reticle mark on reticle R and a mark on a fiducial mark plate at the same time via projection optical system PL, though they are omitted in the drawings. As these reticle alignment systems, the reticle alignment system having a configuration similar to the ones disclosed in, for example, Kokai (Japanese Unexamined Patent Application Publication) No. 7-176468, and the corresponding U.S. Pat. No. 5,646,413, is used. As long as the national laws in designated states (or elected states), to which this international application is applied, permit, the above disclosures of the publication and the U.S. patent are incorporated herein by reference.

Next, exposure operations of exposure apparatus 100 in the embodiment will be described according to a flowchart in FIG. 5 that simplifies the processing algorithm of main controller 20, appropriately referring to other drawings. The exposure operations are described here on the premise that exposure of the first layer on wafer W has been already completed and exposure of the second and subsequent layers will be performed. Also, as the premise of the following operations, wavefront sensor 90 is attached to wafer stage WST, and wavefront sensor 90 and main controller 20 are connected (refer to end points c and d in FIG. 1).

In addition, it is premised that with exposure apparatus 100, as the measurement mode of wavefront aberration and a pupil image of projection optical system PL, a first mode and a second mode are selectable, and either mode is to be selected by an operator via an input device such as a keyboard.

The pupil image in this case means a light source image formed on a pupil plane of projection optical system PL by the light incident on projection optical system PL via the pinhole pattern that will be described later on. The pupil image is affected by a deviation in an optical axis of the light incident on wavefront sensor 90. Therefore, measurement of the pupil image is a type of optical property measurement of projection optical system PL. As a matter of course, the wavefront aberration is a type of optical properties of projection optical system PL.

Furthermore, aberration of the light-receiving optical system inside wavefront sensor 90 is to be small enough to be ignored.

Figure 5:
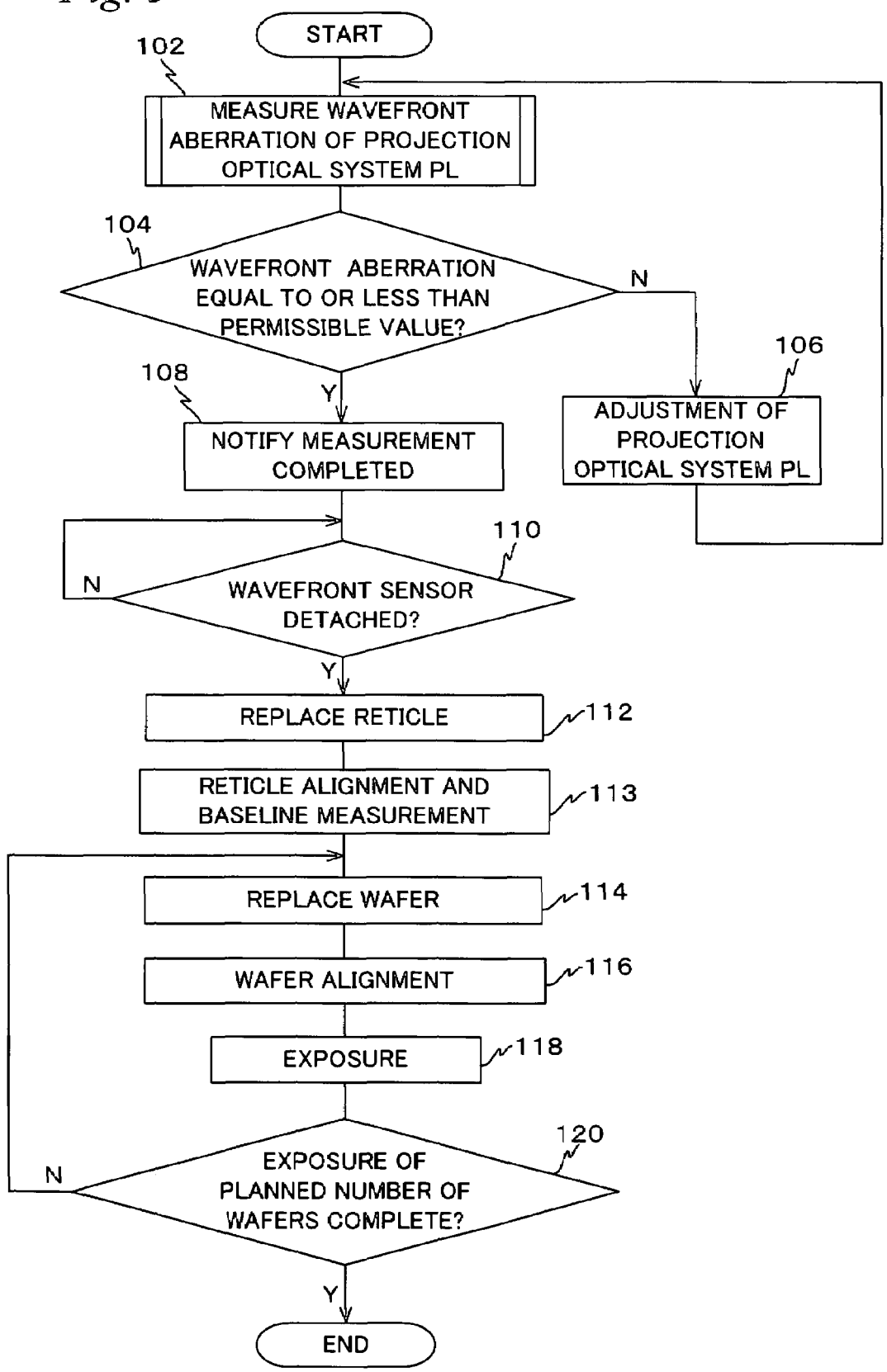
FIG. 5 is a flowchart showing a simplified processing algorithm of main controller 20 on exposure operations of the exposure apparatus in FIG. 1.

First of all, a subroutine processing in step 102 in FIG. 5 of wavefront aberration measurement of projection optical system PL is performed.

Figure 6:
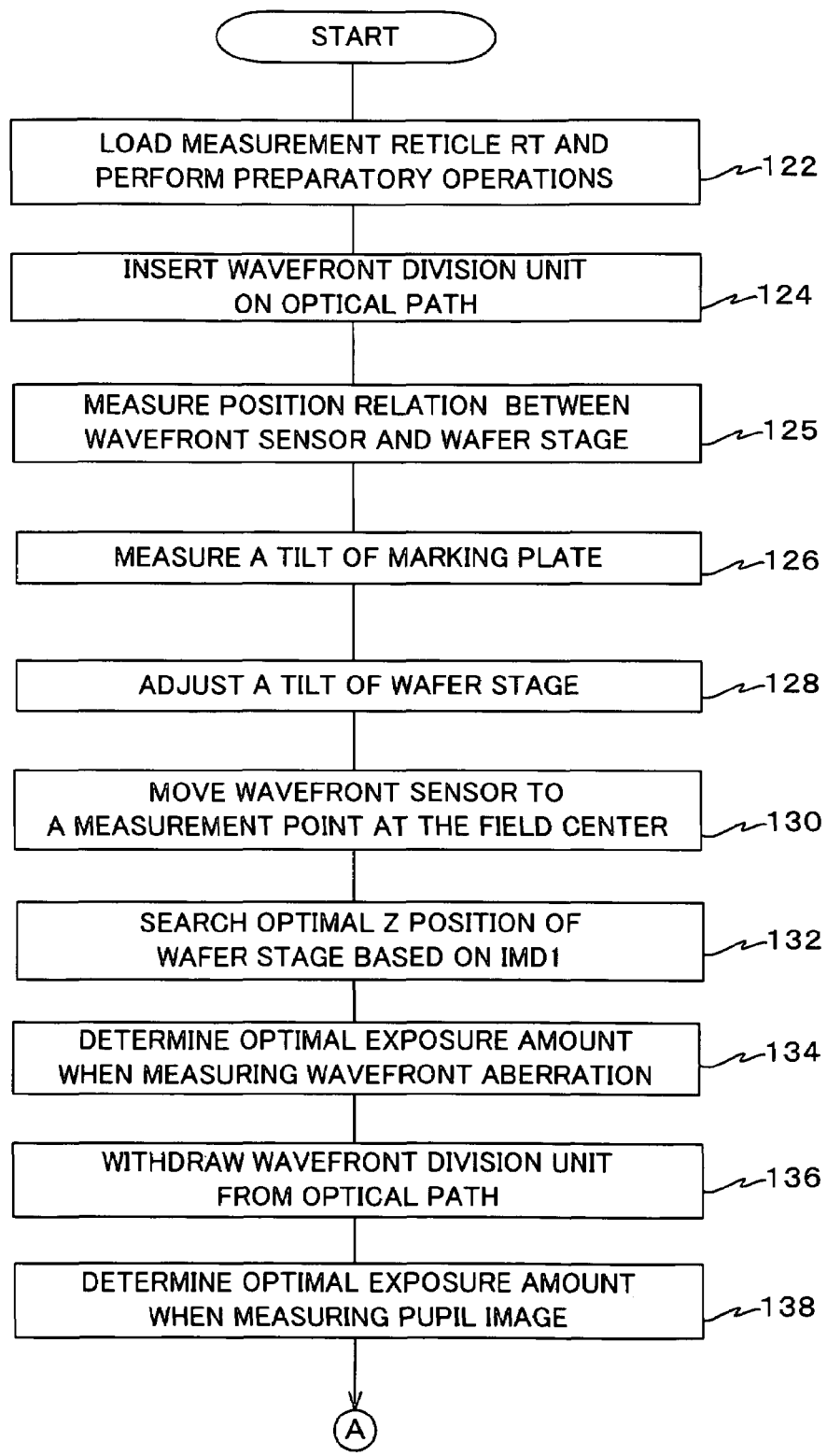
FIG. 6 is a flowchart (No. 1) showing a processing in step 102 in FIG. 5.
Figure 7:
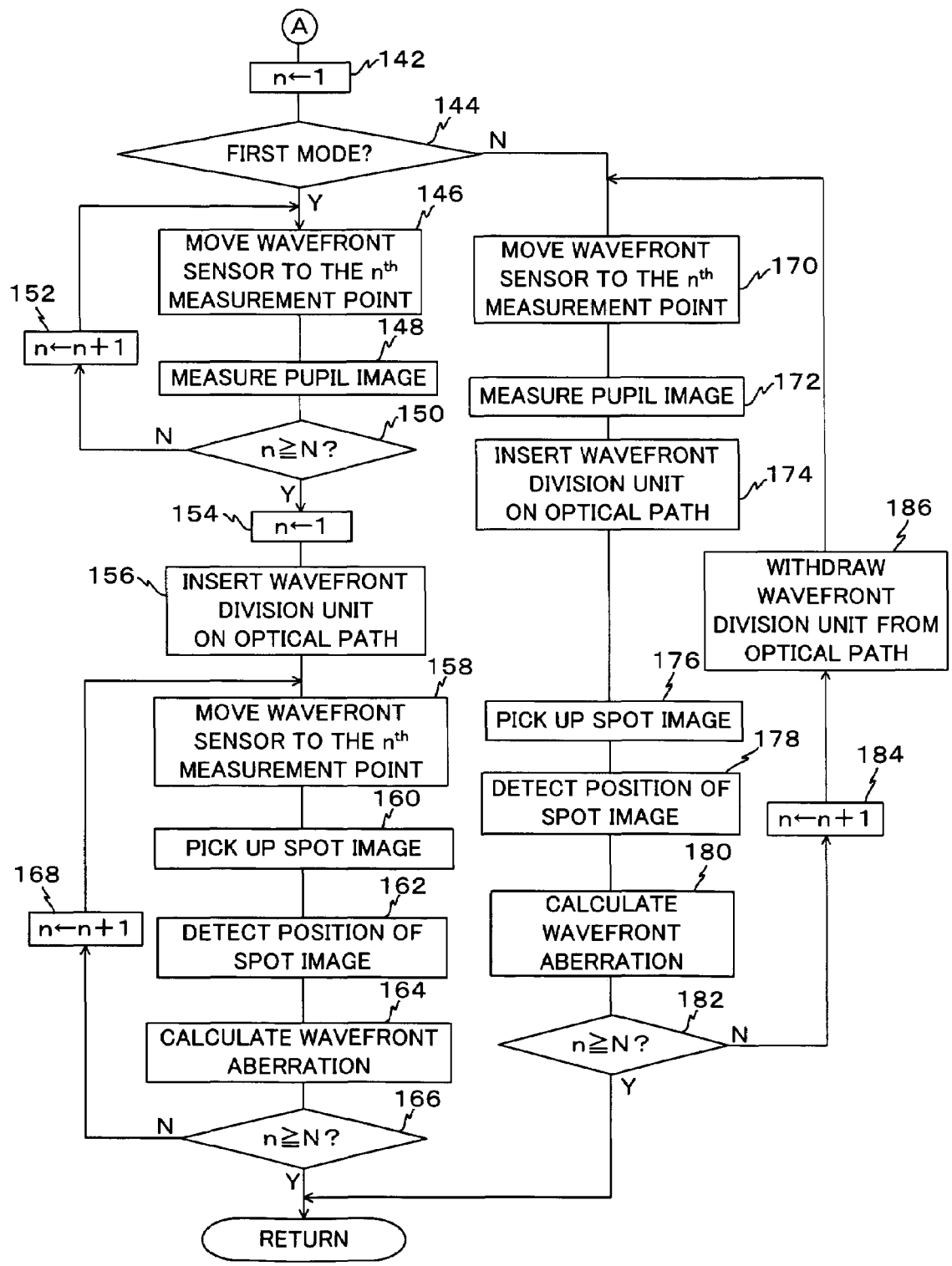
FIG. 7 is a flowchart (No. 2) showing a processing in step 102 in FIG. 5.
Figure 8:
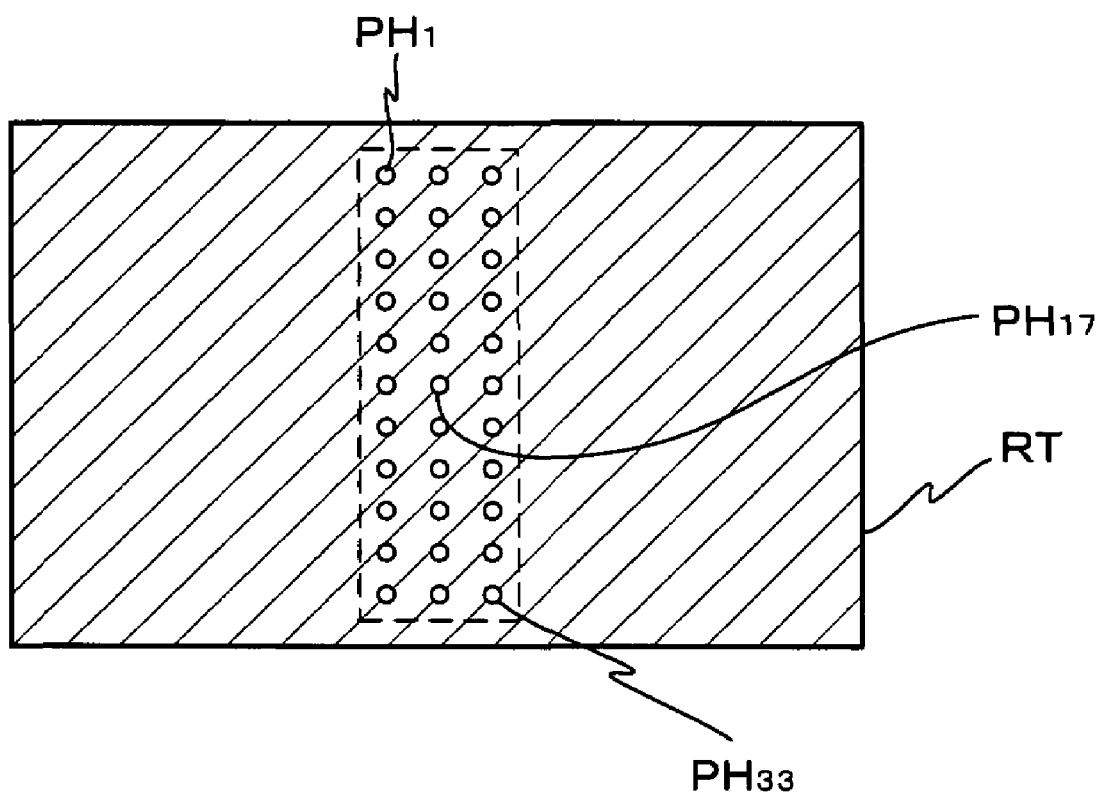
FIG. 8 is a planar view showing an example of measurement reticle.

In subroutine 102, first, in step 122 in FIG. 6, measurement reticle RT shown in FIG. 8 is loaded on reticle stage RST using a reticle loader (not shown), and also predetermined preparatory operations are performed.

On measurement reticle RT as shown in FIG. 8, a plurality of pinhole patterns (in FIG. 8, 3×11=33 of pinhole patterns $PH_n$ (n=1 to 33)) are formed and arranged in a matrix having a row direction and a column direction in the X-axis direction and in the Y-axis direction respectively, in a state where measurement reticle RT is loaded on reticle stage RST. Pinhole patterns $PH_1$ to $PH_{33}$ are formed within an area having a size of a slit-shaped illumination area that is indicated by a dotted line in FIG. 8.

As the predetermined preparatory operations, detection of a relative position of measurement reticle RT to projection optical system PL, baseline measurement of alignment detection system AS and the like are performed. That is, using the reticle alignment systems described earlier, a position relation is detected between a pair of first fiducial marks formed on a fiducial mark plate (not shown) on wafer stage WST and images of reticle alignment marks, which correspond to the first fiducial marks, on measurement reticle RT via projection optical system PL. The detection of the position relation is performed in a state where reticle stage RST is moved to a position at which the area indicated by a dotted line on measurement reticle RT in FIG. 8 substantially coincides with the illumination area described previously. Next, by driving wafer stage WST a predetermined amount within the XY-plane, a position relation of a second fiducial mark formed on the fiducial mark plate to the detection center of alignment detection system AS is detected using alignment detection system AS, and the baseline of alignment detection system AS is calculated based on the above two position relations and the measurement values of the interferometer when detecting the respective position relations.

In step 124, using flow path switching valve 76, vacuum pump 78 and air supply mechanism 66, wavefront division unit 84 is inserted on the optical path (optical axis AX1) inside wavefront sensor 90 in the manner described earlier.

In step 125, a position relation between wavefront sensor 90 attached to wafer stage WST and wafer stage WST is measured. More particularly, by sequentially moving wafer stage WST, each position on a wafer stage coordinate system of at least two two-dimensional position marks 91b in marking plate 91 of wavefront 90 is detected using alignment detection system AS. Based on the detection results of the positions, a position relation between opening 91a in marking plate 91 of wavefront sensor 90 and wafer stage WST is accurately obtained using a predetermined statistical computation such as, for example, the least-squares method.

As a consequence, based on position information (velocity information) output from wafer interferometer 18, the XY-position of opening 91a can be accurately detected. Also, based on the detection results of the XY-position and the baseline previously measured, a position of opening 91a can be set at a desired XY-position with good precision, by controlling movement of wafer stage WST via wafer stage drive section 24.

In step 126, a tilt of marking plate 91 with respect to a plane (XY-plane) perpendicular to optical axis AX of projection optical system PL is measured, using the multiple focal point position detection system (21, 22).

In step 128, based on the measurement results of the tilt, a tilt of wafer stage WST is adjusted via wafer stage drive section 24 to make a tilt of an upper surface of marking plate 91 coincide with a tilt of an image plane (or an approximate plane of the image plane) of projection optical system PL.

In step 130, wafer stage WST is moved so that opening 91a in marking plate 91 of wavefront sensor 90 coincides with a datum measurement point in the field of projection optical system PL, for example, a measurement point at the field center, that is, a measurement point at a position conjugate with pinhole pattern $PH_{17}$ with respect to projection optical system PL (on optical axis AX) as shown in FIG. 9.

In step 132, the optimal Z position (best focus position) of wafer stage WST is searched, based on imaging data IMD1 that is the imaging results of the image of pinhole pattern $PH_{17}$ formed again on the light-receiving surface of CCD95a by each microlens 98 constituting microlens array 94. The specific operations are as follows.

The optical arrangement when performing the search of the optimal Z position, which is developed along optical axis AX1 of wavefront sensor 90 and optical axis AX of projection optical system PL, is shown in FIG. 9A. In such an optical arrangement, when main controller 20 makes light source 6 oscillate laser beam LB and illumination light IL is emitted from illumination optical system 12, the light (illumination light IL) that reaches pinhole pattern $PH_{17}$ of measurement reticle RT is emitted from pinhole pattern $PH_{17}$ as a spherical wave. Then, the light is condensed at opening 91a in marking plate 91 of wavefront sensor 90 after passing through projection optical system PL. The light passing through pinhole patterns $PH_1$ to $PH_{16}$, and $PH_{18}$ to $PH_{33}$ other than pinhole pattern $PH_{17}$ does not reach opening 91a. The wavefront of the light condensed at opening 91a in this manner (the beam of the image of pinhole pattern $PH_{17}$ formed inside opening 91a on the surface of marking plate 91) becomes a rough sphere including wavefront aberration of projection optical system PL.

The light passing through opening 91a is converted by collimator lens 92 into parallel beams, and further, after passing through relay-lens system 93, enters microlens array 94. Each microlens 98 (refer to FIG. 4) of microlens array 94 forms the image of pinhole pattern $PH_{17}$, which has been formed inside opening 91a on the surface of marking plate 91, on an optically conjugate plane of marking plate 91, that is, the imaging plane of (light-receiving surface) of CCD95a. Accordingly, on the imaging plane of CCD95a, spot images (images of pinhole pattern $PH_{17}$) which number corresponds to the number of microlenses 98 constituting microlens array 94 are formed. CCD95a picks up the spot images formed on the imaging plane (light-receiving surface). Imaging data IMD1 obtained by the pickup of CCD95a is transmitted to main controller 20.

Then, while stepping wafer stage WST in the Z-axis direction via wafer stage drive section 24, imaging data IMD1 is loaded. Based on the loaded imaging data IMD1, the optimal Z position of wafer stage WST is searched by locating a position in the Z-axis direction where, for example, the contrast is at maximum.

In step 134, the optimal exposure amount when performing wavefront aberration measurement is determined. More specifically, in a state where a position in the Z-axis direction of wafer stage WST is adjusted to the optimal Z position described above, for example, while changing oscillation frequency (repetition frequency) of light source 6, imaging data IMD1 is repeatedly loaded. And, the optimal exposure amount is determined, by obtaining the repetition frequency corresponding to the imaging data IMD1 that the pulse number with respect to the charge accumulation time at CCD95a is optimum, based on the loaded imaging data IMD1.

In step 136, wavefront division unit 84 is moved away (withdrawn) from the optical path (optical axis AX1) inside wavefront sensor 90, using flow path switching valve 76, vacuum pump 78 and air supply mechanism 66 in the manner previously described.

In step 138, the optimal exposure amount when performing pupil image measurement is determined. The specific operations are as follows.

The optical arrangement when determining the optimal exposure amount when performing pupil image measurement, which is developed along optical axis AX1 of wavefront sensor 90 and optical axis AX of projection optical system PL, is shown in FIG. 9B. In such an optical arrangement, when laser beam LB is oscillated from light source 6, in the same manner as described previously, the light (illumination light IL) that reaches pinhole pattern $PH_{17}$ of measurement reticle RT is emitted from pinhole pattern $PH_{17}$ as a spherical wave. Then, the light is condensed at opening 91a in marking plate 91 of wavefront sensor 90 after passing through projection optical system PL. The light passing through opening 91a is converted by collimator lens 92 into parallel beams, and further, received by CCD95a after passing through relay-lens system 93. With this operation, a light source image on the pupil plane of projection optical system PL is projected on the light-receiving surface of CCD95a. CCD95a picks up the image projected on the imaging plane (light-receiving surface), and imaging data IMD2 obtained by the pickup is transmitted to main controller 20.

For example, while changing the oscillation frequency (repetition frequency) of light source 6, imaging data IMD2 is repeatedly loaded, and the optimal exposure amount when performing pupil image measurement is determined by obtaining the repetition frequency corresponding to imaging data IMD2 that the pulse number with respect to the charge accumulation time at CCD95a is optimum, based on the loaded imaging data IMD2.

In step 142 (FIG. 7), a counter n that indicates the measurement point number is initialized to one (n←1), and the procedure proceeds to step 144, in which it is judged whether or not a first mode is set as a measurement mode of the wavefront aberration and the pupil image of projection optical system PL. Then, when the judgment is affirmative, that is, when the first mode is set as the measurement mode, the procedure proceeds to step 146.

In step 146, wavefront sensor 90 is moved to the $n^{th}$ (the first in this case) measurement point. That is, wafer stage WST is moved so that opening 91a in marking plate 91 of wavefront sensor 90 coincides with the measurement point at a position conjugate with the $n^{th}$ pinhole pattern $PH_n$ with respect to projection optical system PL.

In step 148, the pupil image measurement is performed with the optimal exposure amount that has been determined in step 138. More specifically, in the same manner as in step 138 described earlier, imaging data IMD2 of the pupil image is loaded, and data on the light source image (position information on the light source image such as the center position and the size) is extracted based on imaging data IMD2, and the results are stored in a memory.

In step 150, it is judged whether or not the pupil image measurement is completed at all measurement points, by judging whether or not the value of counter n is equal to or greater than the total number N (N=33 in this case). At this stage, since only the pupil image measurement at the first measurement point is completed, the negative judgment is made. Then, the procedure proceeds to step 152, in which counter n is incremented by one, and the procedure returns to step 146.

Afterward, until the affirmative judgment is made in step 150, a loop processing of steps 146→148→150→152 is repeated. With this operation, the pupil image measurement is performed at the $2^{nd}$ to $33^{rd}$ measurement points within the field of projection optical system PL, that is, at the measurement points at the positions conjugate with pinhole patterns $PH_2$ to $PH_{33}$ with respect to projection optical system PL, and data on the light source image (position information on the light source image such as the center position and the size) via each of pinhole patterns $PH_2$ to $PH_{33}$ is extracted and stored in the memory.

When the pupil image measurement at all measurement points is completed, the procedure proceeds to step 154, in which counter n is initialized to one.

In step 156, wavefront division unit 84 is inserted on the optical path again, then in step 158, wavefront sensor 90 is moved to the $n^{th}$ (the first in this case) measurement point. That is, wafer stage WST is moved so that opening 91a in marking plate 91 of wavefront sensor 90 coincides with the measurement point at a position conjugate with the $n^{th}$ pinhole pattern $PH_n$ with respect to projection optical system PL.

In steps 160 to 164, wavefront aberration measurement at the $n^{th}$ measurement point is executed. That is, first, in step 160, under the optimal exposure amount that is determined in step 134 described earlier, all spot images formed on the light-receiving surface of CCD95a by microlens array 94 is picked up, and its imaging data IMD1 is loaded.

In step 162, based on imaging data IMD1, the position of each spot image formed on the imaging plane of CCD95a by microlens array 94 is detected. More specifically, the center position of each spot image is calculated by calculating the gravity center of the light intensity distribution of each spot image. The center position of each spot image obtained in this manner is stored in the memory as position information on each spot image formed by microlens array 94 on the imaging plane of CCD95a.

In step 164, the position information on each spot image is read out from the memory, and the wavefront aberration of projection optical system PL related to the light passing though the $n^{th}$ (the first in this case) pinhole pattern $PH_1$ of measurement reticle RT is calculated in the manner that will be described later.

The reason why the wavefront aberration can be measured from the position information on the spot image is that the wavefront of the light incident on microlens array 94 is reflected by the wavefront aberration of projection optical system PL when picking up the spot image.

In other words, when there is no wavefront aberration in projection optical system PL, as shown by the dotted line (the broken line) in FIG. 9A, wavefront WF becomes a plane orthogonal to optical axis AX1. In this case, the wavefront of the light incident on microlens 98 is orthogonal to the optical axis, and the spot image that has the center at the intersection point of the optical axis of microlens 98 and the imaging plane of CCD95a is formed on the imaging plane of CCD95a. Meanwhile, when there is wavefront aberration in projection optical system PL, as shown by the double-dashed line in FIG. 9A, wavefront WF' does not become a plane orthogonal to optical axis AX1, but becomes a tilted surface having an angle according to a position of wavefront WF' on the plane. In this case, the wavefront of the light incident on microlens 98 is tilted, and the spot image that has the center at a point deviated a distance corresponding to a tilted amount from the intersection point of the optical axis of microlens 98 and the imaging plane is formed on the imaging plane of CCD95a.

Therefore, in step 164, the wavefront of projection optical system PL related to the light passing through the $n^{th}$ pinhole pattern $PH_n$ of measurement reticle RT is calculated, by obtaining a coefficient of a Zernike polynomial from the difference (the position error) between the position of each spot image expected when there is no wavefront aberration (the intersection point of the optical axis of microlens 98 and the imaging plane of CCD95a) and the detected position of each spot image.

However, the position of each spot image expected when there is no wavefront aberration coincides with the intersection point of the optical axis of microlens 98 and the imaging plane of CCD95a, only in the ideal case where there is no deviation in the optical axis of the incident light and optical axis AX1 and the imaging plane of CCD95a are accurately orthogonal. Thus, in the embodiment, when calculating the above position error, based on data on the light source image (the position information on the light source image such as the center position and the size) at the corresponding measurement point stored in the memory, the position of each spot image expected when there is no wavefront aberration (a datum position used to calculate a deviation amount of each spot image) is respectively corrected, and the difference between the detected position of each spot image and each datum position corrected is calculated. With this operation, the error of the datum position of each spot image when there is no wavefront aberration, which is caused by the deviation in the optical axis of the light incident on wavefront sensor 90, can be cancelled, and the wavefront aberration can be obtained with higher precision.

To be accurate, a position error of microlens array 94 (each microlens 98) occurs due to the insertion to the optical path and the withdrawal from the optical path (taking out and in with respect to the optical path) of microlens array 94, and the position error may cause a position deviation of the spot image. In this case, the actual measurement value of the deviation amount (the position error) of the spot image includes: a. an error component due to aberration, b. an error component due to the deviation in the optical axis, and c. an error component due to the insertion/withdrawal of microlens array 94 with respect to the optical path.

Accordingly, in order to obtain the deviation amount of the spot image more accurately, when the insertion/withdrawal of microlens array 94 with respect to the optical path is repeated a plurality of times in a short period of time, a distribution function is obtained that shows a distribution of the image-forming position of the spot images formed on the imaging plane of CCD95a by microlens 98 substantially located on the optical path. Then, a deviation amount (Δ in the embodiment) from the center of the imaging plane of CCD95a is obtained at the position where the distribution function is at maximum. The deviation amount A includes the error components of the above b. and c. In the embodiment, however, the component of b. can be easily obtained based on the data on the corresponding light source image, and therefore, the error component due to the insertion/withdrawal of microlens array 94 with respect to the optical path can be obtained by subtracting the component of b. from the deviation amount Δ. Thus, when wavefront aberration is actually measured, the error component due to the insertion/withdrawal of microlens array 94 with respect to the optical path can be canceled by using this error component as offset. As a consequence, the wavefront aberration measurement with the same high precision can be performed as in the case when the position reproducibility is favorably secured when inserting/withdrawing microlens array 94 with respect to the optical path.

Referring back to FIG. 7, in step 166, it is judged whether or not measurement of wavefront aberration at all measurement points is completed by judging whether or not the value of counter n is equal to or greater than the total number N (N=33 in this case). At this stage, because only measurement of wavefront aberration at the first measurement point is completed, the judgment is negative, and the procedure proceeds to step 168, in which counter n is incremented by one, and then returns to step 158.

Afterward, until the affirmative judgment is made in step 166, a loop processing of steps 158→160→162→164→166→168 is repeated. With this operation, the wavefront aberration measurement is performed at the $2^{nd}$ to $33^{rd}$ measurement points within the field of the projection optical system PL, that is, at the measurement points at the position conjugate with pinhole patterns $PH_2$ to $PH_{33}$ with respect to projection optical system PL, and the wavefront aberration related to the light passing through each of pinhole patterns $PH_2$ to $PH_{33}$ is calculated, and stored in the memory.

Then, when the wavefront aberration measurement at all measurement points is completed and the affirmative judgment is made in step 166, the procedure returns to step 104 in the main routine in FIG. 5.

On the other hand, in the case the negative judgment is made in step 144 described earlier, that is, the second mode is set as a measurement mode, the procedure proceeds to step 170, and the wavefront sensor 90 is moved to the $n^{th}$ (the first in this case) measurement point. That is, wafer stage WST is moved so that opening 91a in marking plate 91 of wavefront sensor 90 coincides with a measurement point at a position conjugate with the $n^{th}$ pinhole $PH_n$ with respect to projection optical system PL.

In step 172, the pupil image measurement at the $n^{th}$ (the first in this case) measurement point is performed in the same manner as in step 148 described earlier, and data on the light source image (position information on the light source image such as the center position and the size) extracted based on imaging data IMD2 is stored in the memory.

In step 174, after wavefront division unit 84 is inserted on the optical path, in the following steps 176 to 180, measurement of wavefront aberration at the $n^{th}$ (the first in this case) measurement point, that is, measurement of wavefront aberration of projection optical system PL related to the light passing through the $n^{th}$ pinhole pattern $PH_n$ Of measurement reticle RT is performed, in the same manner as in steps 160-164 previously described.

In step 182, it is judged whether or not measurement of the wavefront aberration at all measurement points is completed, by judging whether or not the value of counter n is equal to or greater than total number N (N=33 in this case). At this stage, because only measurement of the wavefront aberration at the first measurement point is completed, the negative judgment is made, and the procedure proceeds to step 184, in which after counter n is incremented by one, and furthermore, after wavefront division unit 84 is withdrawn from the optical path in step 186, the procedure returns to step 170.

Afterward, until the affirmative judgment is made in step 182, a loop processing of steps 170→172→174→176→178→180→182→184→186 is repeated. With this operation, the pupil image measurement and the wavefront aberration measurement in consideration of the results of the pupil image measurement are performed at the $2^{nd}$ to $33^{rd}$ measurement points within the field of the projection optical system PL, that is, the measurement points at the positions conjugate with pinhole patterns $PH_2$ to $PH_{33}$ with respect to projection optical system PL, and the wavefront aberration related to the light passing through each of pinhole patterns $PH_2$ to $PH_{33}$ is calculated, and stored in the memory.

When the wavefront aberration measurement at all measurement points is completed and the judgment is affirmative in step 182, the procedure returns to step 104 in the main routine in FIG. 5.

In step 104, based on data on the wavefront aberration at the N number (33 in this case) of measurement points within the field of projection optical system PL obtained in the above operation, it is judged whether or not the wavefront aberration of projection optical system PL is equal to or less than the permissible value at all measurement points. When the judgment is negative, the procedure proceeds to step 106, and the wavefront aberration of projection optical system PL is adjusted by driving a lens element via image-forming characteristic correction controller 251 so that the wavefront aberration generated at present is reduced, based on the measurement results of the wavefront aberration of projection optical system PL. Depending on circumstances, the lens element of projection optical system PL may be moved within the XY plane or may be replaced by hand.

Then, the processing in the subroutine in step 102 is performed, and the wavefront aberration related to the adjusted projection optical system PL is measured in the same manner as described above. Afterward, until the affirmative judgment is made in step 104, the adjustment of the wavefront aberration of projection optical system PL (step 106) and the measurement of the wavefront aberration (step 102) are repeatedly performed. And, when the affirmative judgment is made in step 104, the procedure proceeds to step 108.

In step 108, the operator is notified that the wavefront aberration has been measured, by an alarm sounded via an input/output device (not shown), and also by showing 'wavefront aberration measurement completed' on the display screen.

In step 110, the procedure waits for wavefront sensor 90 to be detached from wafer stage WST, and when it is confirmed that wavefront sensor 90 has been detached from wafer stage WST from, for example, the output from a sensor (not shown) or a notice from the operator, then the procedure proceeds to step 112.

In step 112, measurement reticle RT loaded on reticle stage RST is unloaded and reticle R on which a pattern to be transferred is formed is loaded on reticle stage RST via a reticle loader (not shown).

In step 113, reticle alignment using the reticle alignment system previously described and a fiducial mark plate (not shown), and baseline measurement using alignment detections system AS and the fiducial mark plate are performed in the same procedure as of a conventional scanning stepper.

In step 114, the wafer on wafer stage WST is replaced using a wafer loader (not shown). (When a wafer is not loaded on wafer stage WST, however, a wafer is simply loaded.)

In step 116, alignment to wafer W (e.g. wafer alignment by the EGA method) is performed. As a result of the wafer alignment, an arrangement coordinate of a plurality of shot areas on wafer W is obtained with good precision. The details of the wafer alignment by the EGA method is disclosed in, for example, Kokai (Japanese Unexamined Patent Application Publication) No. 61-44429, and the corresponding U.S. Pat. No. 4,780,617, and the like. As long as the national laws in designated states (or elected states), to which this international application is applied, permit, the above disclosures of the publication and the U.S. patent are incorporated herein by reference.

In step 118, based on the results of the wafer alignment, exposure by the step-and-scan method is performed, in which the operation in which wafer stage WST is moved to a scanning starting position (acceleration starting position) for exposure of each shot area on wafer W, and the operation in which reticle R is illuminated with illumination light IL and a pattern of reticle R is transferred onto the shot area on wafer W while relatively scanning reticle stage RST and wafer stage WST synchronously in the Y-axis direction are repeated.

During the relative scanning, in particular, during the scanning exposure, position control of reticle stage RST and wafer stage WST is performed so as to keep a position relation between reticle stage RST and wafer stage WST appropriate, based on information on the XY position of reticle stage RST detected by reticle interferometer 16, position information on wafer stage WST detected by wafer interferometer 18, and the Z position of wafer W detected by multiple focal point position detection system (21, 22), leveling information, and the like.

In step 120, it is judged whether or not exposure of the planned number of wafers (e.g. 1 lot) is completed. When the judgment is negative, the procedure returns to step 114, and until the affirmative judgment is made in step 120, a loop processing of steps 114→116→118→120 is repeatedly performed.

Then, when exposure on the planned number of wafers is completed, the affirmative judgment is made in step 120, and a series of processing in the main routine is completed.

As is obvious from the description so far, main controller 20 constitutes a processor that performs a predetermined computation based on a detection signal from detector 95 constituting wavefront sensor 90, and calculates the optical properties of an optical system to be examined, for example, of projection optical system PL, and wavefront sensor 90 and main controller 20 constitute an optical property measuring apparatus.

As have been described so far, with the optical property measuring apparatus that exposure apparatus 100 in the embodiment comprises, using the insertion/withdrawal mechanism (air cylinder 88, flow path switching valve 76, vacuum pump 78 and air supply mechanism 66), microlens array 94 (wavefront division unit 84) is inserted on the optical path of the light via collimator lens 92, which constitutes the light-receiving optical system in housing 97 previously described, at a position in the vicinity of a plane conjugate with the pupil plane of projection optical system PL (and illumination optical system), or the inserted microlens array 94 (wavefront division unit 84) is withdrawn from the optical path. And, in a state where microlens array 94 is inserted on the optical path, the light via projection optical system PL enters collimator lens 92 and is received by detector 95 via microlens array 94, then a detection signal (e.g. imaging data IMD1 described earlier) including information on projection optical system PL is output from detector 95. In this case, since the wavefront on the pupil plane of projection optical system PL is divided by microlens array 94, the detection signal (e.g. imaging data IMD1 described earlier) including information on the optical properties of projection optical system PL related to each divided wavefront is output from detector 95.

Meanwhile, in a state where microlens array 94 is withdrawn from the optical path, the light via projection optical system PL enters collimator lens 92 and is received by detector 95 without passing through microlens array 94, then a detection signal (e.g. imaging data IMD2 described earlier) including information on the optical properties of projection optical system PL is output from detector 95. In this case, the detection signal (e.g. imaging data IMD2 described earlier) including information on the optical properties of projection optical system PL related to the shape and position of the pupil plane and the like is output from detector 95.

In either case, the light via projection optical system PL is received by detector 95 without passing through a half mirror, and therefore, measurement precision of the optical properties (the wavefront aberration in the above example) obtained based on the detection signal (e.g. imaging data IMD1, IMD2) from detector 95 cannot be deteriorated due to polarization property existing in the half mirror. Accordingly, it is possible to measure the optical properties (e.g. wavefront aberration) of projection optical system PL with high precision.

In addition, in the embodiment, when measuring the wavefront aberration of projection optical system PL, main controller 20 functioning as a processor calculates the wavefront aberration as a first optical property of projection optical system PL (an optical system to be examined) based on the detection signal from detector 95 in a state where microlens array 94 is inserted on the optical path by the insertion/withdrawal mechanism previously described. To be more accurate, when measuring the wavefront aberration of projection optical system PL, the wavefront formed by irradiating illumination light IL on pinhole pattern $PH_n$ Of measurement reticle RT is divided by microlens array 94, a deviation of a spot image obtained for each microlens 98 of microlens array 94 from a fiducial position is detected, and the wavefront aberration is obtained as the first optical property of projection optical system PL (the optical system to be examined) using, for example, a Zernike polynomial and the like.

In addition, main controller 20 calculates data (position information on the light source image such as the center position and the size) on the pupil image (light source image) previously described as a second optical property of projection optical system PL, based on the detection signal from detector 95, in a state where microlens array 94 is withdrawn from the optical path by the insertion/withdrawal mechanism described earlier. This is because it is desirable to correct a deviation in the fiducial position used to obtain the wavefront aberration based on the position and size of the pupil of projection optical system PL, in order to obtain the wavefront aberration with good precision using the Zernike polynomial. In other words, as is described earlier, with the light source image picked up by detector 95 serving as a detection object, the position of the light source image is detected with good precision, and the deviation in the fiducial position is corrected based on the detected position and size of the light source image. Therefore, in the embodiment, the wavefront aberration can be measured with good precision.

In addition, with exposure apparatus 100 in the embodiment, the wavefront aberration that is a total aberration can be measured as the optical properties of projection optical system in the on-body state with good precision using the optical property measuring apparatus as is described above. And, after projection optical system PL is adjusted based on the wavefront aberration of projection optical system PL, exposure is performed using projection optical system PL in which various aberrations are sufficiently reduced. Thus, it becomes possible to transfer a pattern formed on reticle R onto wafer W with good precision.

In the embodiment, the case has been described where measurement reticle RT on which a plurality of pinhole patterns are formed is loaded onto reticle stage RST, measurement reticle RT is illuminated with illumination light IL, a spherical wave generated at the pinhole patterns formed on measurement reticle RT is made incident on projection optical system PL, and the pupil image measurement or the pinhole pattern image measurement is performed using wavefront sensor 90. It is a matter of course, however, that the measurement object of the optical property measuring apparatus of the present invention is not limited to these.

That is, the optical property measuring apparatus may be applied to measurement of various optical properties of optical systems other than the aberration measurement of optical systems. For example, the numerical aperture (illumination N.A.) or coherence factor value a of illumination optical system 12 can be measured using the optical property measuring apparatus (90, 20). For example, in a state where reticle R is not held on reticle stage RST, or in a state where a glass reticle that does not shield the light irradiated on reticle stage RST is held, wafer stage WST is moved so that opening 91a in marking plate 91 of wavefront sensor 90 is positioned on optical axis AX. Such movement is performed by main controller 20 that controls wafer stage drive section 24 based on position information (velocity information) of wafer stage WST detected by wafer interferometer 18, as is described earlier. When this operation is performed, wavefront division unit 84 of wavefront sensor 90 is in a state withdrawn from the optical path.

With this optical arrangement, illumination light IL emitted from an illumination system passes though projection optical system PL, and then reaches opening 91a in marking plate 91 of wavefront sensor 90. The light passing though opening 91a is converted into parallel beams by collimator lens 92, and the parallel beams enter CCD95a after passing though relay-lens system 93. When the parallel beams enter CCD95a, CCD95a picks up light source images formed on the imaging plane (light-receiving surface).

Its imaging data IMD2 is sent to main controller 20, and, in the same manner as the pupil image measurement described earlier, main controller 20 extracts each pixel corresponding to the light source image and the position and size of the light source image is detected.

Coherence factor value σ (illumination σ) is defined by a ratio between the size of the light source image on an entrance pupil plane of projection optical system PL and the size of the entrance pupil. In the case when the size of the entrance pupil is known, a position of the entrance pupil plane of projection optical system PL and a position of the imaging plane of CCD95a of wavefront sensor 90 that is a plane roughly conjugate with the entrance pupil plane are known, and the magnification of the light source image on the imaging plane of CCD95a with respect to the light source image on the entrance pupil plane of projection optical system PL is also known, main controller 20 can obtain coherence factor value σ (illumination σ) from the size of the light source image picked up by CCD95a.

In addition, the illumination N.A. can be obtained by calculation using coherence factor σ obtained in the above manner and the known N.A. of projection optical system PL. However, in the case when a position of the entrance pupil plane of projection optical system PL and a position of the imaging plane of CCD95a of wavefront sensor 90 that is a plane roughly conjugate with the entrance pupil plane are known, and the magnification of the light source image on the imaging plane of CCD95a with respect to the light source image on the entrance pupil plane of projection optical system PL is also known, main controller 20 can obtain the illumination N.A. with simple calculation from the size of the light source image picked up by CCD95a.

In this manner, also when obtaining the illumination σ or the illumination N.A., main controller 20 can accurately detect the size of the light source image picked up by CCD95a in a state where microlens array 94 is withdrawn from the optical path. Therefore, the illumination σ or the illumination N.A. can be measured with high precision as the second optical property of the optical system to be examined.

The illumination condition under which the illumination σ is measured is not limited to the normal illumination, and the annular illumination, the quadrupole illumination and the like may be used. That is, an area where the illumination light is distributed on the pupil plane of the illumination optical system is not limited to a circular shape, an oval shape, or the like. A plurality of local areas distributed almost equidistant from the optical axis of the annular illumination or illumination optical system, and the like may be possible.

In the above embodiment, the number of aperture patterns on measurement reticle RT is 11×3=33, however, it is possible to increase or decrease the number depending on a desired measurement precision of the wavefront aberration. Also, the array number and the array form of microlenses 98 of microlens array 94 can be changed depending on a desired measurement precision of the wavefront aberration.

In addition, in the above embodiment, the case has been described where microlens array 94 serving as a wavefront division optical element is inserted to or withdrawn from the optical path of the light entering collimator lens 92 by the insertion/withdrawal mechanism that is composed of air cylinder 88, flow path switching valve 76, vacuum pump 78 and air supply mechanism 66, and is controlled by main controller 20. However, the present invention is not limited to this, and an insertion/withdrawal mechanism with which the insertion/withdrawal of a microlens to/from the optical path is manually performed may be employed. Such an insertion/withdrawal mechanism may be structured including, for example, a guide so as to guide wavefront division unit 84 in a vertical direction.

Furthermore, in the above embodiment, when measuring the wavefront aberration of projection optical system PL, measurement reticle RT is loaded on reticle stage RST. However, it may also be possible to constantly fix a pattern plate, on which a pinhole pattern is formed as on the measurement reticle, on reticle stage RST, and perform position alignment of the pattern plate with respect to the field of projection optical system PL so as to perform measurement of the wavefront aberration of projection optical system PL.

In addition, in the above embodiment, the aberration of the light-receiving optical system inside wavefront sensor 90 is small enough to be ignored. However, for example, when the wavefront aberration measurement with higher precision is performed, the wavefront aberration of the light-receiving optical system alone may be measured at any point until the wavefront aberration is calculated. Such measurement of the wavefront aberration of the light-receiving optical system alone can be realized by irradiating illumination light IL emitted from projection optical system PL on a pattern plate and performing the wavefront aberration measurement as is described above, in a state where the pattern plate, on which a pinhole pattern having a size enough to generate a spherical wave by irradiation of illumination light IL via projection optical system PL, is arranged on or in the vicinity of marking plate 91, and opening 91a is further restricted by the pinhole pattern of the pattern plate. And, when calculating the wavefront aberration of projection optical system PL, the wavefront aberration of the light-receiving optical system alone may be used as a correction value.

Likewise, in order to obtain the wavefront aberration with good precision, dark current of CCD95a is measured at any point until the wavefront aberration is calculated, and when a value of each pixel (luminance value) is obtained, an offset caused by the dark current may be corrected. Performing such offset correction is good for the case such as when the pupil image measurement described earlier is performed.

In addition, in the above embodiment, the case has been described where the wavefront aberration measurement and the wavefront aberration adjustment of projection optical system PL are performed at the time of periodical maintenance after assembly of the exposure apparatus and the like to prepare for exposure of a wafer that follows. However, the adjustment of the wavefront aberration may be performed in the same manner as in the above embodiment, at the time of adjustment of projection optical system PL when manufacturing the exposure apparatus. Incidentally, on adjustment of projection optical system PL when manufacturing the exposure apparatus, in addition to the position adjustment of a part of lens elements constituting projection optical system PL that is performed in the above embodiment, position adjustment of other lens elements, reprocessing of lens elements, and replacement of lens elements can be performed.

In addition, in the above embodiment, the case has been described where wavefront sensor 90 is freely detachable to wafer stage WST. However, the present invention is not limited to this, and wavefront sensor 90 may be permanently installed in wafer stage WST.

In the above embodiment, the fly-eye lens is used as optical integrator 222, however, a micro fly-eye lens may be used instead. In this case, since the intensity distribution of the light source image is further uniform than the case fly-eye lens 222 is used, it becomes easier to extract each pixel corresponding to the light source image. In addition, an internal reflection type integrator (a rod integrator or the like) may be used as an optical integrator, and in this case, as the light source image, its virtual image is detected.

In the above embodiment, the case has been described where the present invention is applied to the optical property measuring apparatus including wavefront sensor 90 by the Shack-Hartmann method. However, the present invention is not limited to this, and can be applied to any unit that has a wavefront division optical element internally and can measure targeted optical properties by inserting or withdrawing the wavefront division optical element to/from a light-receiving optical path.

The light source 6 of the exposure apparatus in the above embodiment is not limited to a pulsed ultraviolet light source such as the $F_2$ laser source, the ArF excimer laser source, and the KrF excimer laser source, and an extra-high pressure mercury lamp that emits an emission line such as a g-line (wavelength: 436 nm) or an i-line (wavelength: 365 nm) can also be used. In addition, a harmonic wave may be used that is obtained by amplifying a single-wavelength laser beam in the infrared or visible range emitted by a DFB semiconductor laser or fiber laser, with a fiber amplifier doped with, for example, erbium (or both erbium and ytteribium), and by converting the wavelength into ultraviolet light using a nonlinear optical crystal. Also, the magnification of the projection optical system is not limited to a reduction system, and an equal magnification or a magnifying system may be used.

In the above embodiment, the case of a scanning exposure apparatus has been described, however, the present invention can be applied to any exposure apparatus comprising a projection optical system regardless of types of apparatus such as the step-and-repeat, the step-and-scan, and the step-and-stitching.

The usage of the exposure apparatus is not limited to the exposure apparatus for manufacturing semiconductors, and the present invention can also be widely applied to the exposure apparatus for, for example, an exposure apparatus for liquid crystal that transfers a liquid crystal display device pattern onto a square shaped glass plate, an exposure apparatus used for manufacturing organic EL, thin-film magnetic heads, micromachines, DNA chips or the like. In addition, the present invention can be applied to an exposure apparatus that transfers a circuit pattern onto a glass substrate or a silicon wafer, not only when producing microdevices such as semiconductor devices, but also when producing a reticle or a mask used in exposure apparatus such as an optical exposure apparatus, an EUV exposure apparatus, an X-ray exposure apparatus, or an electron beam exposure apparatus.

[Device Manufacturing Method]

Next, an embodiment will be described of a device manufacturing method that uses the above exposure apparatus in the lithography step.

Figure 10:
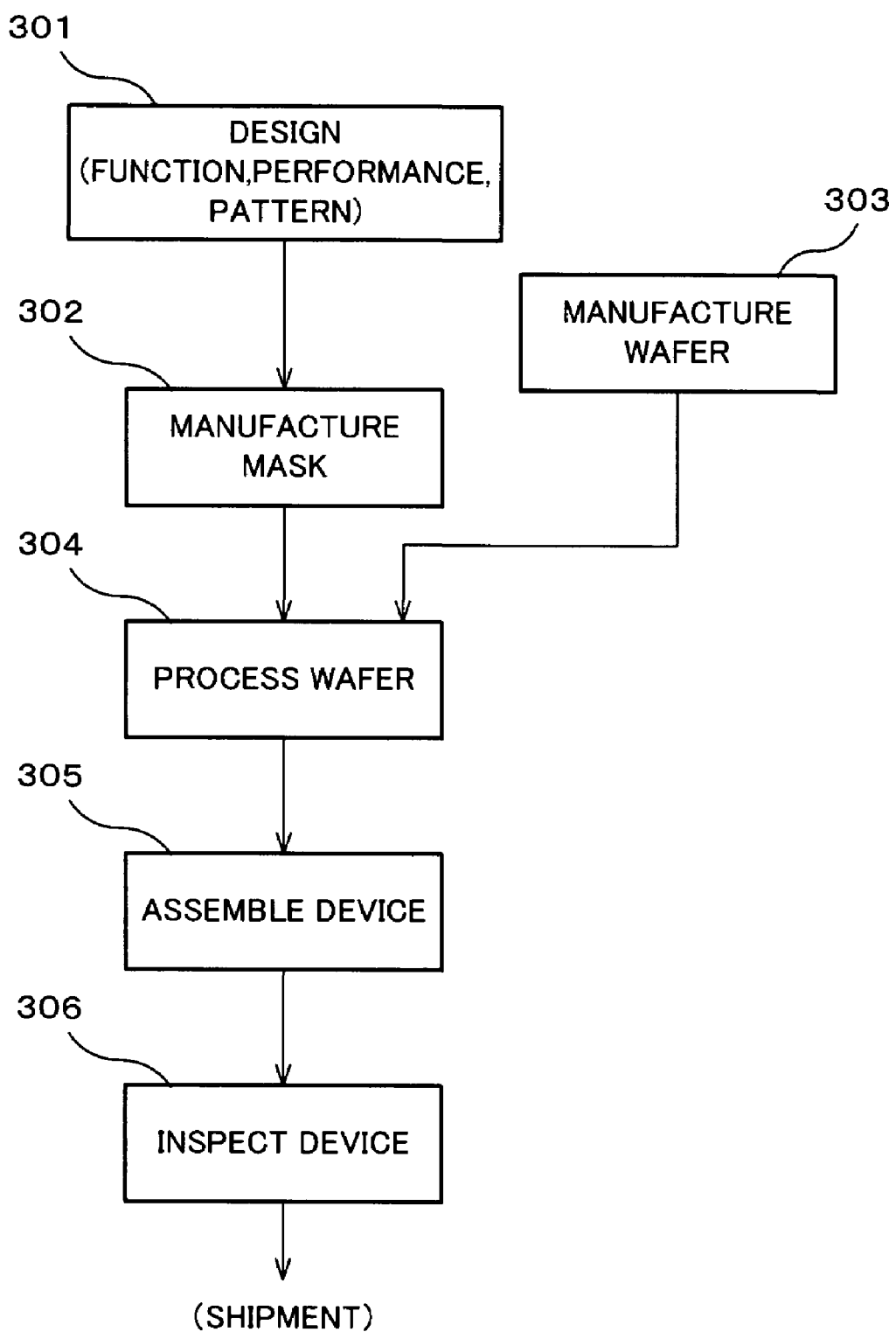
FIG. 10 is a flowchart used to explain a device manufacturing method.

FIG. 10 shows the flowchart of an example when manufacturing a device (a semiconductor chip such as an IC or an LSI, a liquid crystal panel, a CCD, a thin-film magnetic head, a micromachine, and the like). As shown in FIG. 10, in step 301 (design step), function and performance design of device (circuit design of semiconductor device, for example) is performed first, and pattern design to realize the function is performed. Then, in step 302 (mask manufacturing step), a mask on which the designed circuit pattern is formed is manufactured. Meanwhile, in step 303 (wafer manufacturing step), a wafer is manufactured using materials such as silicon.

Next, in step 304 (wafer processing step), the actual circuit and the like are formed on the wafer by lithography or the like in a manner that will be described later, using the mask and the wafer prepared in steps 301 to 303. Then, in step 305 (device assembly step), device assembly is performed using the wafer processed in step 304. Step 305 includes processes such as the dicing process, the bonding process, and the packaging process (chip encapsulation), and the like when necessary.

Finally, in step 306 (inspection step), tests on operation, durability, and the like are performed on the devices made in step 305. After these steps, the devices are completed and shipped out.

Figure 11:
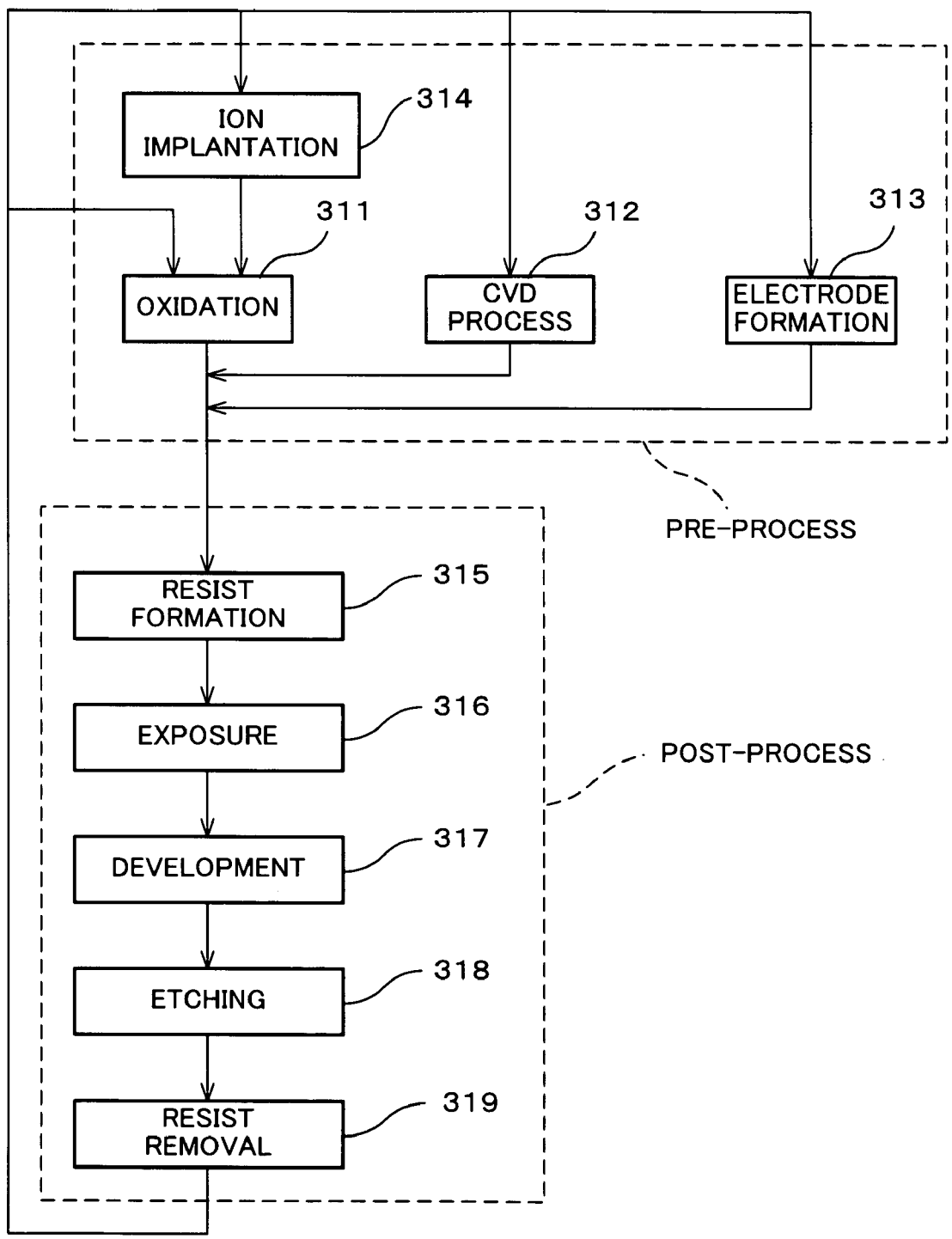
FIG. 11 is a flowchart showing a concrete example related to step 316 in FIG. 10.

FIG. 11 is a flowchart showing a detailed example of step 304 described above. Referring to FIG. 11, in step 311 (oxidation step), the surface of wafer is oxidized. In step 312 (CDV step), an insulating film is formed on the wafer surface. In step 313 (electrode formation step), an electrode is formed on the wafer by deposition. In step 314 (ion implantation step), ions are implanted into the wafer. Each of the above steps 311 to 314 constitutes the pre-process in each step of wafer processing, and the necessary processing is chosen and is executed at each stage.

When the above-described pre-process ends in each stage of wafer processing, post-process is executed as follows. In the post-process, first in step 315 (resist formation step), a photosensitive agent is coated on the wafer. Then, in step 316 (exposure step), the circuit pattern of the mask is transferred onto the wafer by the lithography system (exposure apparatus) and the exposure method described above. Next, in step 317 (development step), the exposed wafer is developed, and in step 318 (etching step), an exposed member of an area other than the area where resist remains is removed by etching. Then, in step 319 (resist removing step), when etching is completed, the resist that is no longer necessary is removed.

By repeatedly performing the pre-process and the post-process, multiple circuit patterns are formed on the wafer.

When the above device manufacturing method of the embodiment described above is used, because the exposure apparatus of the embodiment above is used in the exposure process (step 316), a pattern of a reticle can be transferred on a wafer with good precision. As a consequence, the productivity (including the yield) of high integration devices can be improved.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. An optical property measuring apparatus that measures optical properties of an optical system to be examined, said apparatus comprising:
an optical system that includes a wavefront division optical element which can be inserted and withdrawn with respect to an optical path of a light via said optical system to be examined and which divides a wavefront of said light via said optical system to be examined when being inserted to said optical path of said light:
an insertion/withdrawal mechanism connected to the wavefront division optical element, which inserts and withdraws said wavefront division optical element with respect to said optical path; and
a detector that receives said light via said optical system, and outputs a detection signal including information on optical properties of said optical system to be examined.

2. The optical property measuring apparatus of claim 1 wherein
said wavefront division optical element is arranged at a position in the vicinity of a plane conjugate with a pupil of said optical system to be examined.

3. The optical property measuring apparatus of claim 1 wherein
said wavefront division optical element is a microlens array.

4. The optical property measuring apparatus of claim 1, further comprising:
a processor that calculates optical properties of said optical system to be examined by performing a predetermined computation, based on the detection signal from said detector.

5. The optical property measuring apparatus of claim 4 wherein
said processor calculates a first optical property of said optical system to be examined based on the detection signal from said detector in a state where said wavefront division optical element is inserted to said optical path by said insertion/withdrawal mechanism.

6. The optical property measuring apparatus of claim 5 wherein
said first optical property is a wavefront aberration of said optical system to be examined.

7. The optical property measuring apparatus of claim 4 wherein
said processor calculates a second optical property of said optical system to be examined based on the detection signal from said detector in a state where said wavefront division optical element is withdrawn from said optical path by said insertion/withdrawal mechanism.

8. The optical property measuring apparatus of claim 7 wherein
said second optical property is an optical property related to information on at least one of a position and a shape of a light source image on a pupil plane of said optical system to be examined or a plane conjugate with the pupil plane.

9. The optical property measuring apparatus of claim 8 wherein
said optical system to be examined includes an illumination optical system, and
said second optical property is one of a numerical aperture and a coherence factor of said illumination optical system.

10. An exposure apparatus that transfers a pattern formed on a mask onto a photosensitive object, said apparatus comprising:
an illumination optical system that illuminates said mask with an illumination light;
a projection optical system that projects said illumination light emitted from said mask on said photosensitive object;
an object stage that moves two-dimensionally holding said photosensitive object; and
the optical property measuring apparatus in claim 1, which is attached to said object stage so that said projection optical system becomes said optical system to be examined.

11. The exposure apparatus of claim 10 wherein
at least a part of said optical property measuring apparatus is freely detachable to said object stage.

12. A device manufacturing method including a lithography process wherein
in said lithography process, a pattern is transferred onto a photosensitive object using the exposure apparatus in claim 10.

13. An exposure apparatus that transfers a pattern formed on a mask onto a photosensitive object via an optical system, said apparatus comprising:
the optical property measuring apparatus in claim 1.

14. An optical property measuring method in which optical properties of an optical system to be examined are measured, said method comprising:
performing insertion and withdrawal of a wavefront division optical element with respect to an optical path of a light via said optical system to be examined;
detecting a first information based on a light via said optical system to be examined and said wavefront division optical element, in a first state where said wavefront division optical element is inserted into said optical path;
detecting a second information based on a light via said optical system to be examined, in a second state where said wavefront division optical element is withdrawn from said optical path; and
calculating optical properties of said optical system to be examined based on said first information and said second information.

15. The optical property measuring method of claim 14 wherein
in said calculating, among optical properties of said optical system to be examined a first optical property is calculated.

16. The optical property measuring method of claim 15, further comprising:
measuring an error component caused by the insertion and withdrawal of said wavefront division optical element with respect to said optical path.

17. The optical property measuring method of claim 16 wherein
in said measuring, said error component caused by the insertion and withdrawal is calculated, by obtaining a distribution function that shows a distribution of an image-forming position of a predetermined spot image formed on an image-forming plane of said wavefront division optical element when the insertion and withdrawal of said wavefront division optical element are repeated with respect to said optical path a plurality of times, obtaining a deviation amount of a position where the distribution function is at maximum from a center of said image-forming plane, and subtracting an error component caused by a deviation in an optical axis of a light incident on said wavefront division optical element from the deviation amount.

18. The optical property measuring method of claim 14 wherein
said optical system to be examined includes a projection optical system that projects a pattern.

19. The optical property measuring method of claim 14 wherein
in said calculating, among the optical properties of said optical system to be examined said first optical property and said second optical property are calculated.

20. The optical property measuring method of claim 19 wherein
said first optical property is a wavefront aberration of said projection optical system, and
said second optical property is a light source image formed on a pupil plane of said projection optical system.

21. The optical property measuring method of claim 14 wherein
a judgment is made of whether or not the first optical property of said projection optical system calculated in said calculating is equal to or less than a predetermined permissible value, and when the first optical property exceeds the permissible value, adjustment of the first optical property of said projection optical system and measurement of said first optical property are repeated until said first optical property becomes equal to or less than said permissible value.

22. An exposure method comprising:
executing the optical property measuring method in claim 14 using a projection optical system as said optical system to be examined; and
transferring a pattern onto a photosensitive object using said projection optical system to which said optical property measuring method has been executed.

23. A device manufacturing method including a lithography process in which the exposure method in claim 22 is used.

* * * * *